United States Patent [19]

Yamada

[11] Patent Number: 5,594,444
[45] Date of Patent: Jan. 14, 1997

[54] ANALOG-TO-DIGITAL CONVERTER HAVING REDUCED CIRCUIT AREA

[75] Inventor: Chikara Yamada, Tokyo, Japan

[73] Assignee: Sony Corporation, Tokyo, Japan

[21] Appl. No.: 611,085

[22] Filed: Mar. 5, 1996

Related U.S. Application Data

[63] Continuation of Ser. No. 163,763, Dec. 9, 1993, Pat. No. 5,598,161.

[30] Foreign Application Priority Data

| Dec. 18, 1992 | [JP] | Japan | 4-355504 |
| Dec. 22, 1992 | [JP] | Japan | 4-356837 |
| Dec. 25, 1992 | [JP] | Japan | 4-358926 |
| Dec. 29, 1992 | [JP] | Japan | 4-361550 |
| Dec. 29, 1992 | [JP] | Japan | 4-361551 |

[51] Int. Cl.$^6$ .............................. H03M 1/36; H03M 1/14
[52] U.S. Cl. .............................. 341/159; 341/156; 327/75
[58] Field of Search .............................. 341/133, 155, 341/156, 158, 159; 327/74, 75

[56] References Cited

U.S. PATENT DOCUMENTS

| 4,897,656 | 1/1990 | van de Plassche et al. | 341/159 |
| 4,924,227 | 5/1990 | Mangelsdorf | 341/159 |
| 4,928,103 | 5/1990 | Lane | 341/159 |
| 5,384,569 | 1/1995 | Komatsu | 341/159 |
| 5,497,155 | 3/1996 | Izuhara | 341/156 |

*Primary Examiner*—Howard L. Williams
*Attorney, Agent, or Firm*—Ronald P. Kananen

[57] ABSTRACT

In an analog-to-digital converter, a plurality of divided output currents are produced by dividing at a predetermined ratio each of a plurality of comparison output currents that are produced for each reference potential, and an output voltage generated by each divided comparison output current is further divided by an output means into a plurality of output voltages. A combination of output voltages which are in reversed-phase, and the relationship of which in magnitude is reversed at an intermediate potential between first and second reference potentials, is selected from the plurality of output voltages produced by the above division. According to this construction, comparison outputs of an input analog signal with respect to arbitrary virtual potentials between the two reference potentials actually given can easily be obtained.

6 Claims, 32 Drawing Sheets

| VOLTAGE FOR COMPARISON | COMBINATIONS FOR OBTAINING COMPARISON OUTPUT WITH RESPECT TO VOLTAGE FOR COMPARISON |
|---|---|
| $V_{REF1}$ | V114 AND V118, V114 AND V123, V113 AND V117, V113 AND V116<br>V112 AND V117, V112 AND V116, V111 AND V115, V122 AND V115 |
| V1 | V114 AND V125, V114 AND V124, V111 AND V117, V111 AND V116<br>V122 AND V117, V122 AND V116 |
| V2 | V113 AND V118, V113 AND V123, V112 AND V118, V112 AND V123<br>V115 AND V119 |
| V3 | V114 AND V126, V113 AND V125, V113 AND V124, V112 AND V125<br>V112 AND V124, V111 AND V118, V111 AND V123, V122 AND V118<br>V122 AND V123, V119 AND V117, V119 AND V116 |
| V4 | V111 AND V125, V111 AND V124, V122 AND V125, V122 AND V124 |
| V5 | V113 AND V126, V112 AND V126, V119 AND V118, V119 AND V123 |
| $V_{REF2}$ | V111 AND V126, V122 AND V126, V119 AND V125, V119 AND V124 |

ANALOG-TO-DIGITAL CONVERTER HAVING REDUCED CIRCUIT AREA

This application is a continuation of application Ser. No. 08/163,763 filed Dec. 3, 1993, U.S. Pat. No. 5,598,161.

BACKGROUND OF THE INVENTION

1. Field of the Invention

This invention relates to a voltage comparison circuit and more particularly, to a voltage comparison circuit used for the signal comparing section of an analog-to-digital converter.

2. Description of the Related Art

Presently, a comparator is used in various signal processing circuits to process an analog signal by converting it to a digital signal.

In particular, a large number of comparators are incorporated in an analog-to-digital conversion circuit (hereinafter called A-D conversion circuit) which converts an analog signal into a digital signal by comparing an analog signal with many reference voltages.

However, in the A-D conversion circuit, with the increase of the resolution, comparators need to occupy a very large part of an integrated circuit, thus unavoidably increasing the area of the entire integrated circuit. Therefore, a comparator is now required of a type which can produce comparison outputs as a result of simultaneous comparison with a plurality of reference voltages even in a small circuit area.

A comparator of the above type is shown in FIGS. 1 and 3, and the characteristics of the output voltage is shown in FIGS. 2 and 4 respectively. Here, the comparator shown in FIG. 1 is explained. The comparator sets the resistances of load resistors connected to differential amplifiers as different values in accordance with respective reference voltages $V_{REF}$ and outputs the comparison with respect to a virtual voltage by comparing the output voltages of two differential amplifiers.

In this comparator, the resistances of the load resistors R1 and R2 connected to a differential amplifier 1A (including transistors Q1 and Q2) that receives an input voltage $V_{IN}$ and a reference voltage $V_{REF1}$, and the resistances of the load resistors R3 and R4 connected to a differential amplifier 1B (including transistors Q3 and Q4) that receives an input voltage $V_{IN}$ and a reference voltage $V_{REF2}$, ($=V_{REF1}+\Delta V$) are set at a ratio of 3:1. This comparator can produce a comparison output with respect to a virtual potential that internally divides the two reference voltages $V_{REF1}$ and $V_{REF2}$ at a ratio of 1:3.

This comparator uses the relationship in which output voltages V11 and V12 of the differential amplifiers 1A and 1B are proportional to their gains G1 and G2 (that is, the resistances of the load resistors), and is based on the principle that the output voltages V11 and V12 become equal at a potential Vc (a potential at the intersection of a solid line and a dashed line in FIG. 2) that is given by following equation:

$$V_C = \frac{G1 \cdot V11 + G2 \cdot V12}{G1 + G2} \quad (1)$$

That is, the potential Vc at which the two output voltages V11 and V12 are equal is obtained by internally dividing the output voltages V11 and V12 at a ratio between the gains G1 and G2. In this example, since the resistances of the load resistors R1 and R2 and those of the load resistors R3 and R4 are set at a ratio of 3:1, the potential Vc, at which the two output voltages V11 and V12 are equal, takes a value that internally divides the reference voltages $V_{REF1}$ and $V_{REF2}$ at 1:3. That is, a comparison output can be obtained with respect to a virtual potential that divides the interval between the reference voltages into four.

For these analog-to-digital converters, various conversion modes have been proposed according to fields of utilization, required accuracy, and velocity. Especially in fields requiring operation at a specially high speed, parallel (flash) type analog-to-digital converters are widely used.

In a parallel type analog-to-digital converter, an input signal $V_{IN}$ is input into comparators in parallel, through which a potential at which to invert the logical value of a plurality of the comparative output is converted into binary data as a potential of the input signal $V_{IN}$. For example, a parallel type analog-to-digital converter 23 with a resolution of eight bits is shown in FIG. 5.

That is, the parallel type analog-to-digital converter 23 supplies reference voltages VRT and VRB to one end and the other end of 256 reference resistors $R_{R1}$ to $R_{R256}$ connected in series, so as to generate 255 reference voltages respectively across reference resistors $R_{R1}$ to $R_{R256}$. The analog input signal $V_{IN}$ is then input into comparators COMP (CA1 to CA255) to which these reference voltages are applied in order to draw comparisons with the reference voltages (FIG. 6).

Subsequently, the analog-to-digital converter 23 supplies an encoder 25 with the comparative output of comparators CA1 to CA256 via a differentiator 24 composed of AND circuits AND1 to AND255 so that the input signal $V_{IN}$ should be converted into 8-bit digital data.

However, since parallel type analog-to-digital converters are analog-to-digital converters designed for high-speed operation, they need an extremely large number of comparators. For instance, to construct a parallel type analog-to-digital converter with a resolution of eight bits, it used to be needed to provide approximately ten thousand circuit elements, with the result of an unavoidably larger chip area.

Moreover, analog-to-digital converters designed for specially high speed operation often need much operating current because each element is operated with high speed, with the result of no less than several watts in power consumption on account of their constituent integrated circuits containing numerous circuit elements.

Hence, it is desired to realize a parallel-type analog-to-digital converter entailing still lower power consumption and a still smaller circuit area.

Furthermore, in the case where the number of element and the chip area are reduced, the serial-parallel A-D converter circuit is better than the parallel A-D converter circuit.

To simplify explanation, a 4-bit serial-parallel A-D converter circuit 31 with two bits of high-order and low-order resolution capability, respectively, will be explained below (FIG. 7).

This 4-bit serial-parallel A-D converter circuit 31 generates three sets of reference voltages V31, V32, and V33 which divide the reference voltages into four voltage ranges by means of 16 resistances which are connected in series between the reference voltages ($V_{REFT}$ and $V_{REFB}$) and first compares by high-order comparators 32 whether or not input signal $V_{IN}$ is greater than three sets of reference voltages, and then generates high-order output data D1A and D2A by supplying positive-phase comparative output and reverse phase comparative output for each reference voltage to an AND circuit 33.

The serial-parallel A-D converter circuit 31 supplies bias voltage to the current source of low-order comparators corresponding to this voltage range, selects three sets of low-order comparators from among low-order comparators CO1 to CO12, and compares three sets of reference voltages, which divide each voltage range into four equal parts in the selected three sets of low-order comparators, with input signal $V_{IN}$, respectively.

The serial-parallel A-D converter circuit 31 generates low-order output data D3A and D4A by supplying comparative output, which is fetched from the common load resistance, to common comparators 34A, 34B, and 34C and by supplying their positive-phase comparative outputs and reverse phase comparative outputs to an AND circuit 34 through a buffer amplifier.

As understood from FIG. 7, the numbers of high-order and low-order comparators are determined by the high-order and low-order resolution capability (that is, m bits and n bits) and are needed in a quantity of $2^m-1$ and in a quantity of $2^n-1$, respectively.

Since the high-order comparators are used to roughly classify the upper and lower reference potentials, the number of high-order comparators can be smaller than that of low-order comparators in general.

However, this high-order comparator needs a fixed circuit area for wiring. Therefore, a converter circuit in which wiring is easy and the number of comparators is a few is desired because it needs only a small circuit area.

SUMMARY OF THE INVENTION

In view of the foregoing, a first object of this invention is to provide a voltage comparison circuit which can produce output voltages at equal output speeds even with the use of a small number of elements.

A second object of this invention is to realize an analog-to-digital converting circuit which has smaller chip area as compared with a conventional circuit by using a non-linear shape converting method.

A third object of this invention is to realize an analog-to-digital converting circuit which has smaller chip area as compared with a conventional circuit by using both of a non-linear converting method (Vernier) and an interpolation method.

A fourth object of this invention is to provide a flash analog-to-digital converter using a non-linear shape converting method and an interpolation method.

A fifth object of this invention is to provide a series-parallel analog-to-digital converter using a non-linear shape converting method and an interpolation method.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 23 to 27 are diagrams for explaining the operation of the comparator of FIG. 22;

FIG. 28 is a circuit diagram of a comparator in the seventeenth embodiment according to this invention;

DETAILED DESCRIPTION OF THE PREFERRED EMBODIMENT

Preferred embodiments of this invention will be described with reference to the accompanying drawings:

A first embodiment of this invention will be explained using FIG. 8.

At first, the full scale expansion principle by resistance division will be explained.

The input analog signal $V_{IN}$ is attenuated by a voltage gradient different from the voltage gradient of the reference potential $V_{REF}$. Then the full scale of the input analog signal $V_{IN}$ is expanded to the full scale of the reference potential $V_{REF}$ by comparing the attenuated analog input signal which has been attenuated and the reference potential $V_{REF}$.

Here the voltage gradient of input analog signal $V_{IN}$ is set to one half of the voltage gradient of the reference potential.

A case will be explained in which the full scale of the input analog signal $V_{IN}$ will be expanded to the double of the full scale of the reference voltage $V_{REF}$ by taking an example of the A-D convertor circuit having an 8-bit resolution.

Figure 1:
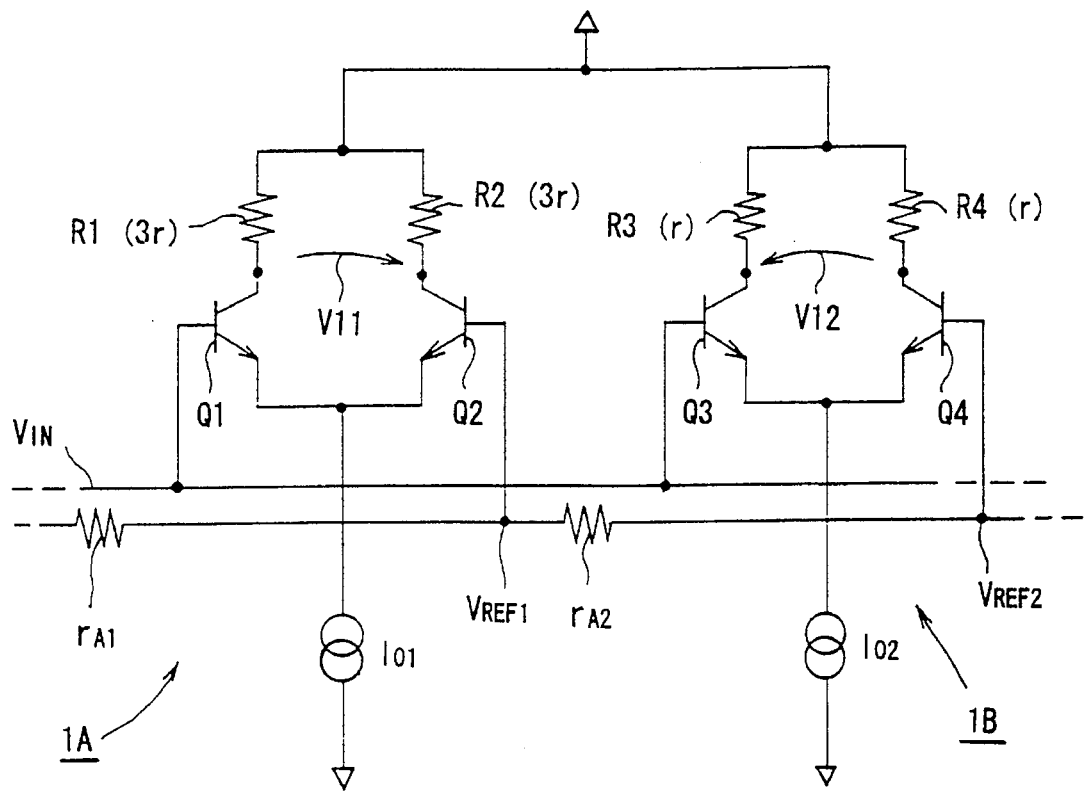
FIG. 1 is a circuit diagram showing a comparator in the first related art.
Figure 2:
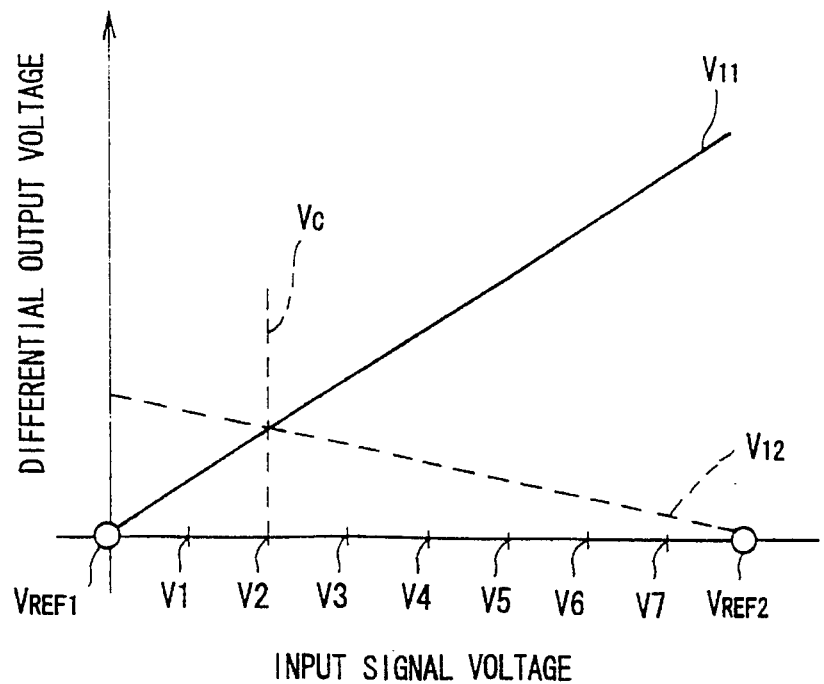
FIG. 2 is a diagram showing an input-output characteristic of the comparator of FIG. 1.
Figure 3:
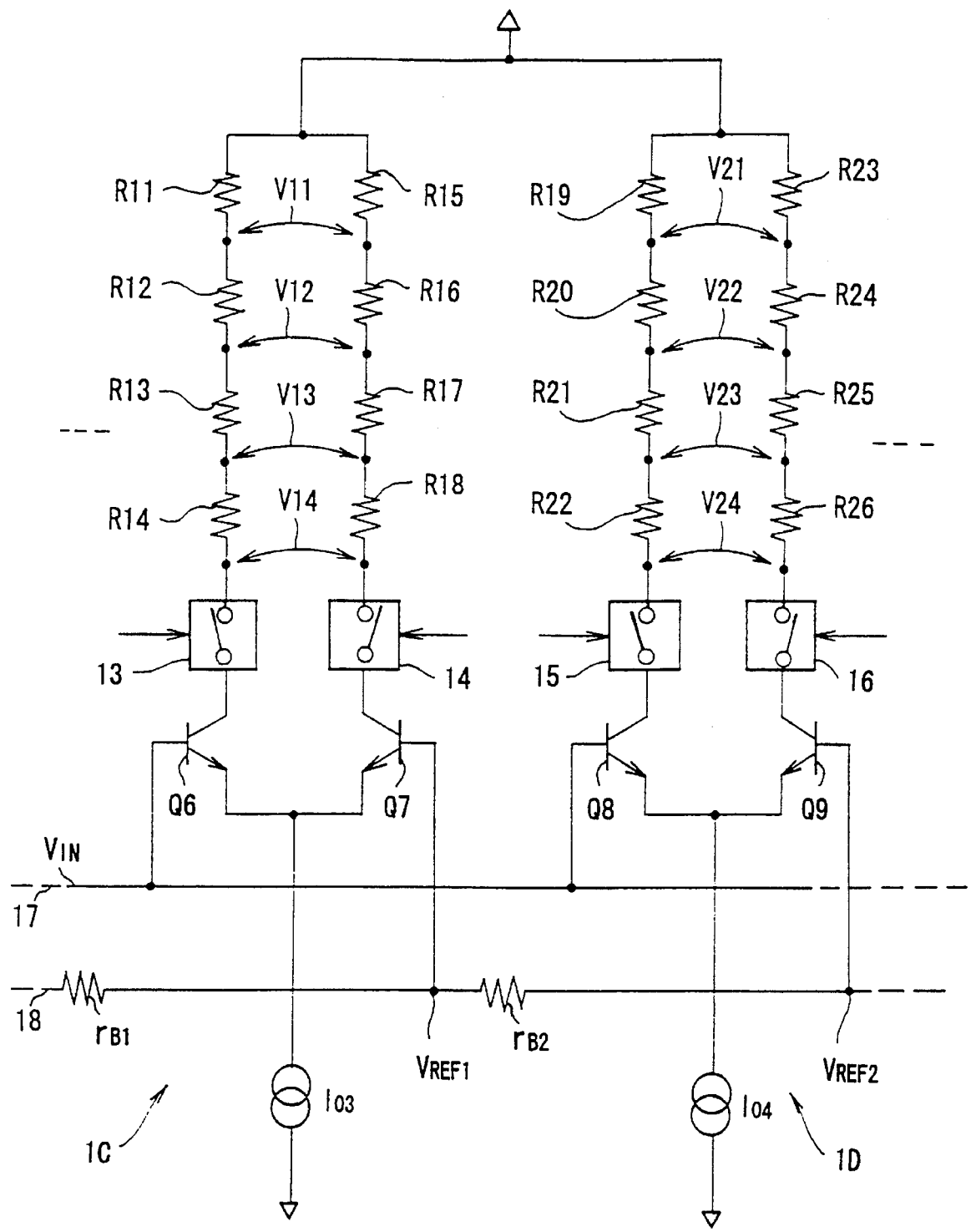
FIG. 3 is a circuit diagram of a comparator in the second related art.
Figure 4:
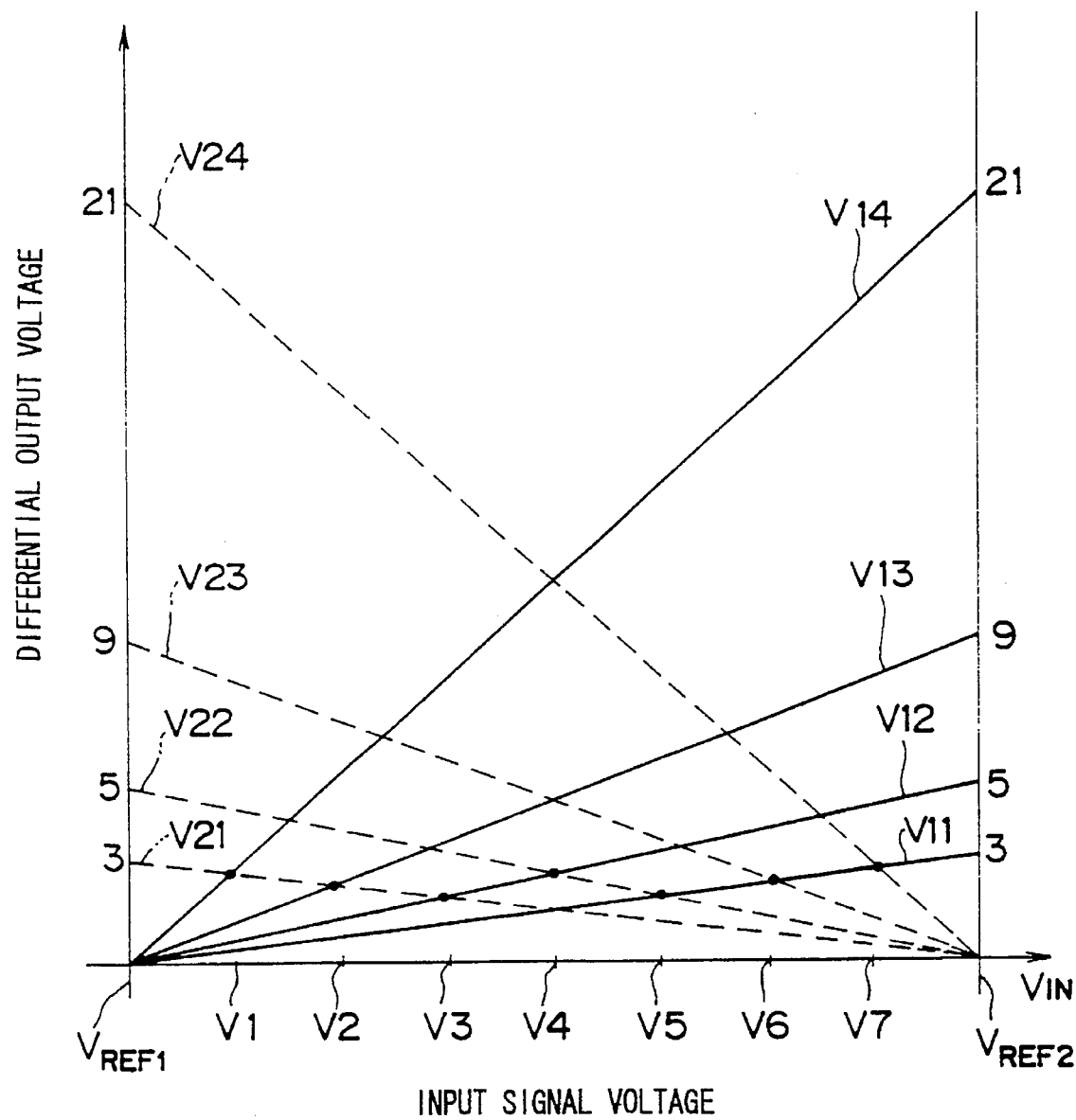
FIG. 4 is a diagram showing an input-output characteristic of the comparator of FIG. 3.
Figure 5:
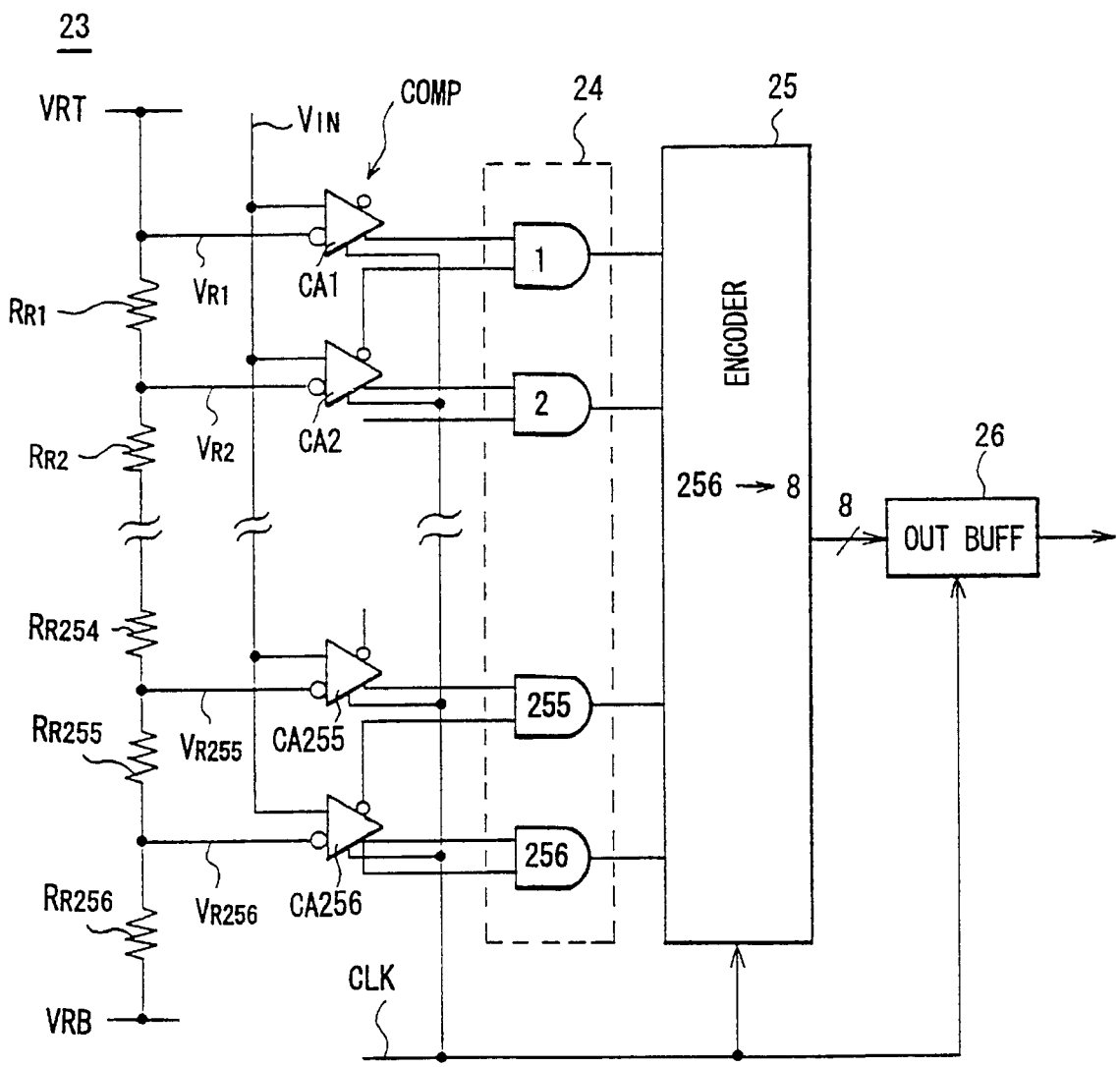
FIG. 5 is a circuit diagram of a parallel A-D converter in the third related art.
Figure 6:
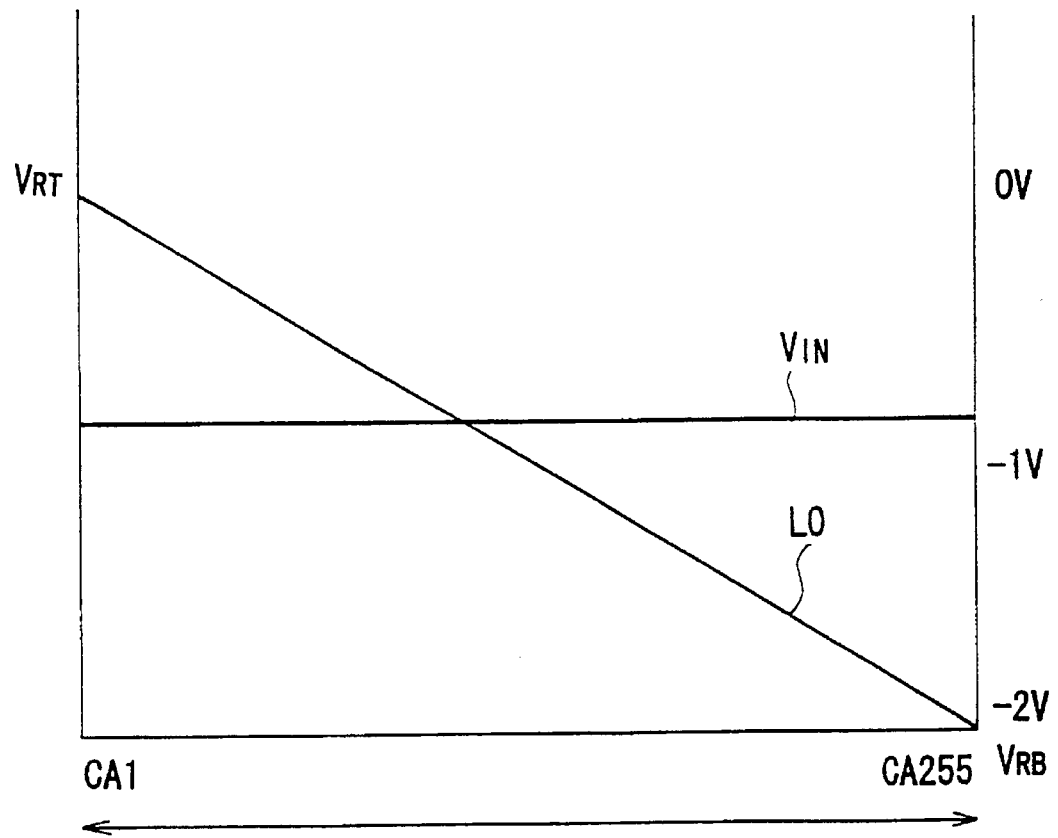
FIG. 6 is a diagram for explaining the operation of the A-D converter of FIG. 5.
Figure 7:
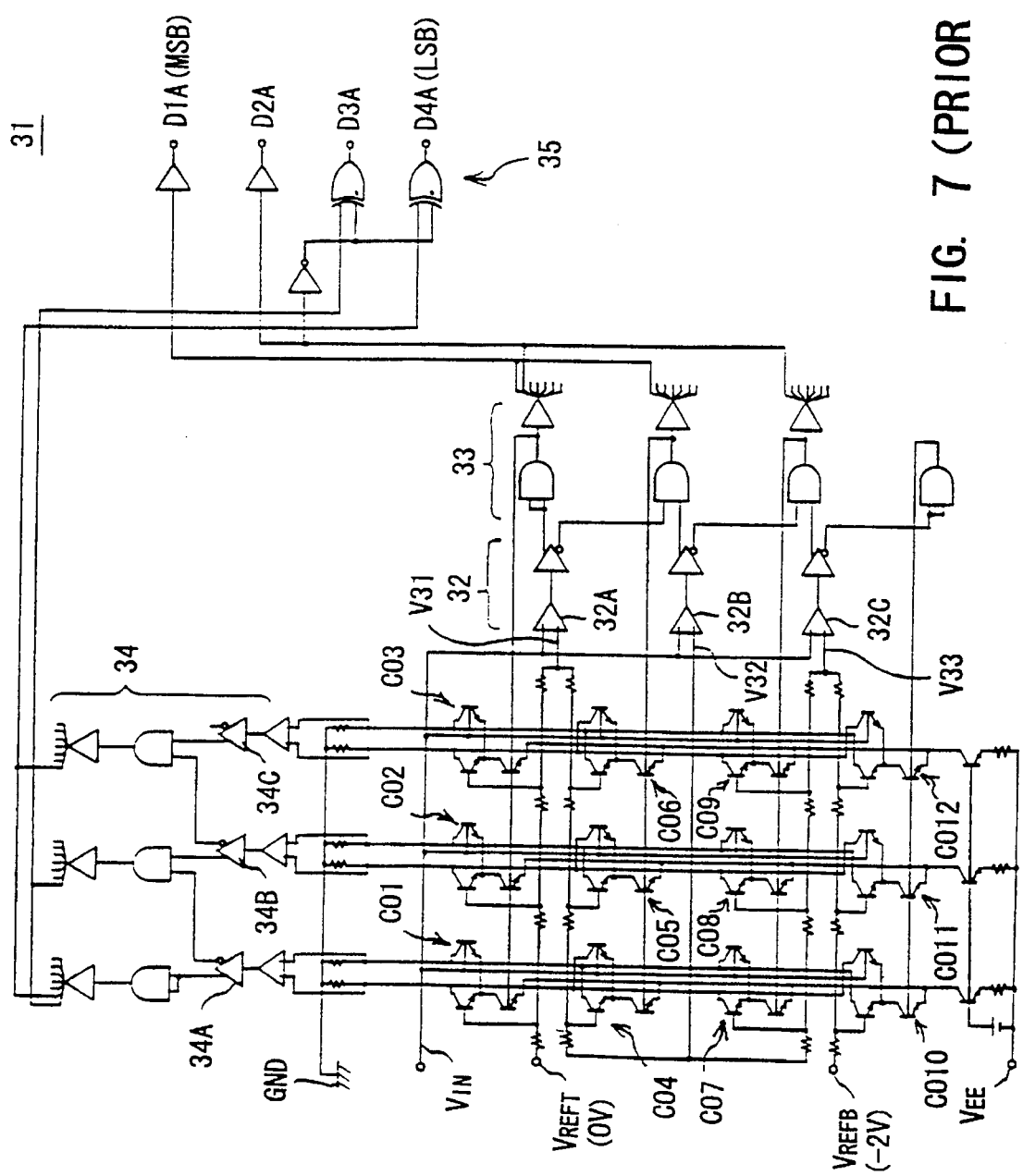
FIG. 7 is a circuit diagram of a series-parallel A-D converter in the fourth related art.
Figure 8:
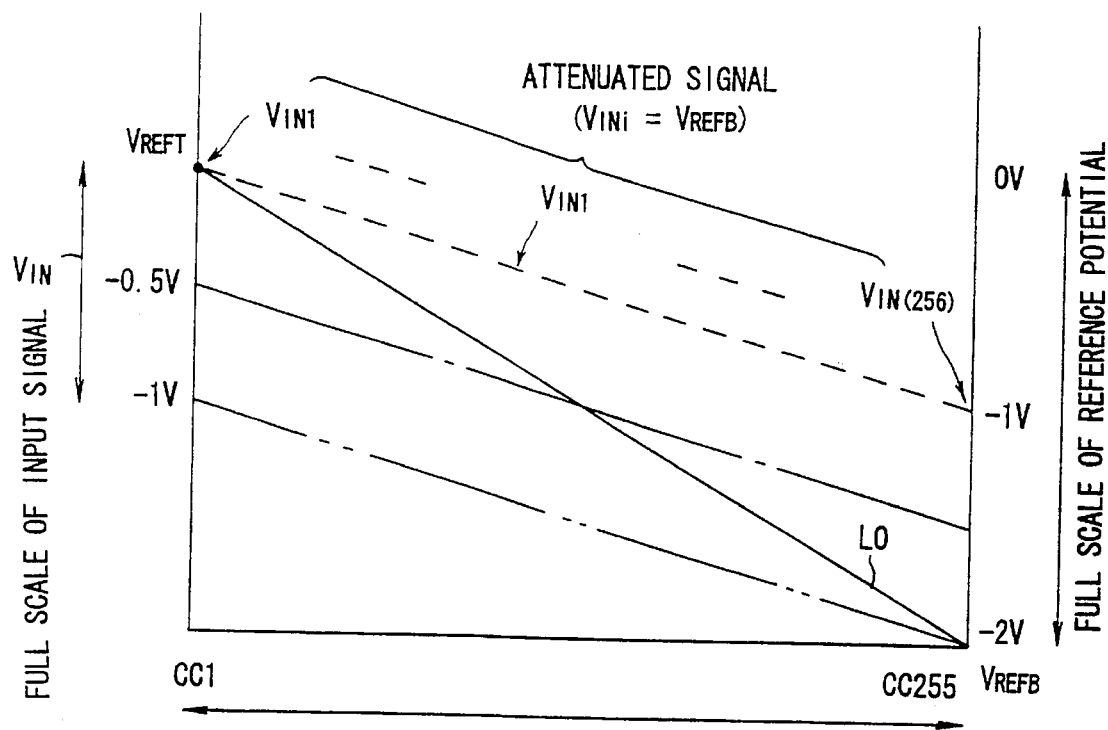
FIG. 8 is a graph for explaining the principle of this invention.

Referring to FIG. 8, the transverse axis designates the number of steps whereas the longitudinal axis designates the reference potential $V_{REF}$ entered to each comparator and the potential of the attenuated analog signal $V_{INi}$ (i=1, 2, ..., 255) entered to each comparator.

Here the maximum potential $V_{REFT}$ and the minimum potential $V_{REFB}$ are respectively offered to the comparators CC1 and CC255 located on both ends of the group of 255 comparators. On the other hand, to the comparators CC2 through CC254 located in the middle are offered 253 reference voltages $V_{REFi}$ (i=2, 3, ..., 254) that are arranged on the straight line connecting the maximum $V_{REFT}$ and the minimum $V_{REFB}$ in an interval of a selected voltage.

On the other hand, the input analog signal $V_{IN}$ is attenuated to one half of the voltage gradient (shown in a dotted line in FIG. 8) of the reference potential (shown in a solid line in FIG. 8) by each of 256 divided voltage resistor connected in series to be offered to each comparator CC1 to CC255.

Consequently, at the first comparator CC1 and the 255th comparator CC255, the potential difference is generated which is one half of the full scale of the reference voltage (that is, $V_{REFT}-V_{REFB}$).

Consequently when the input analog signal $V_{IN}$ is varied from the maximum value $V_{REFT}$ to the middle value of the full scale, the position of the comparator where the value scale of the potential is inverted between a series of attenuated signal and the reference voltage $V_{REFi}$ is moved from the first comparator CC1 to the 255th comparator CC255.

In this way, the input analog signal $V_{IN}$ can be converted into digital data by obtaining the position of a comparator $C_{iB}$ where the potential magnitude relationship between the potential of the attenuated analog signal and the reference potential is inverted.

Since the full scale of the input analog signal $V_{IN}$ can be one half the full scale of the reference potential $V_{REF}$, the load loaded on the drive stage which amplifies the input analog signal $V_{IN}$ can be made smaller and the S/N ratio can be improved.

Overall construction of the embodiment will be explained.

Figure 9:
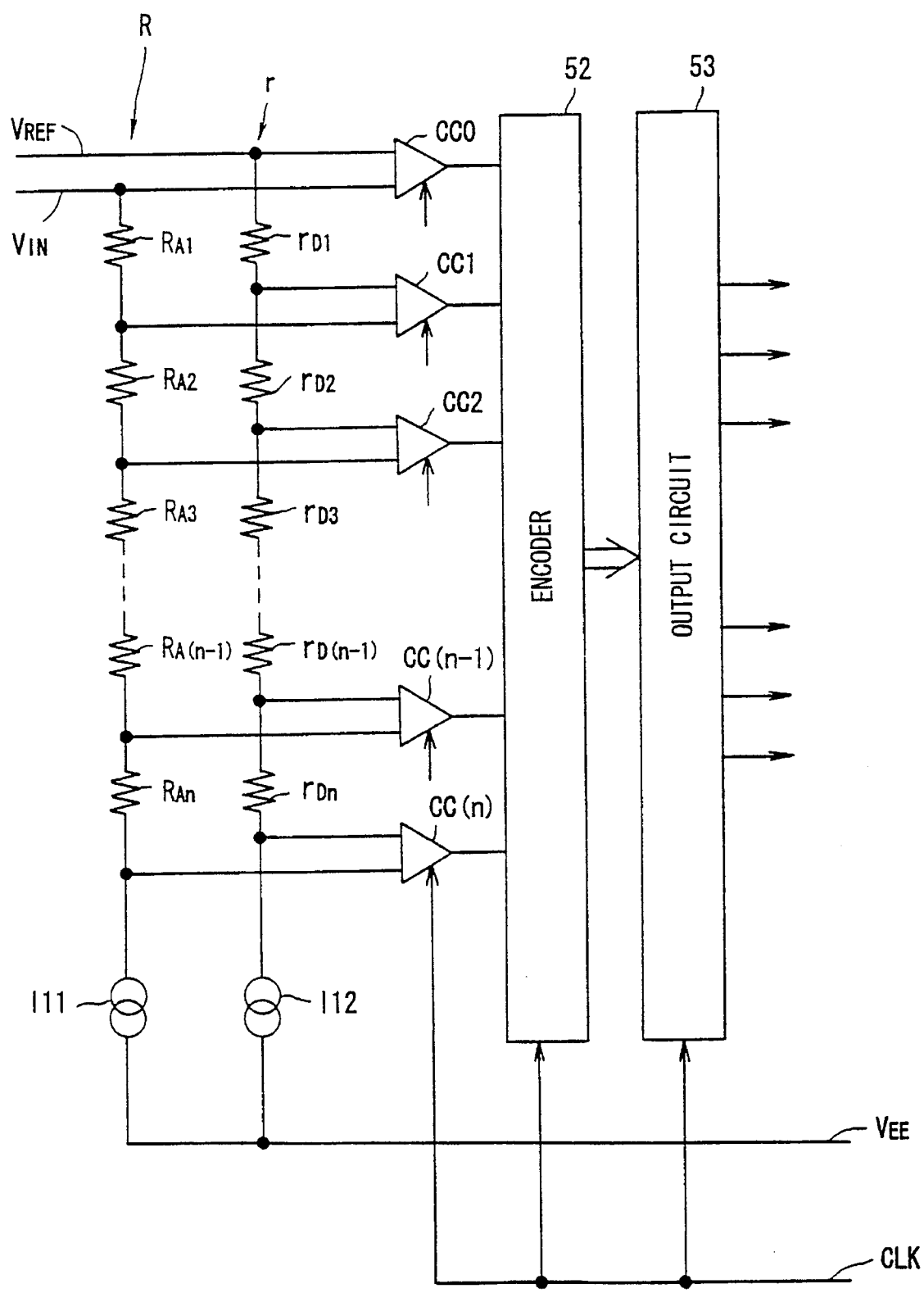
FIG. 9 is a circuit diagram of an A-D converter in the first embodiment according to this invention.

Referring to FIG. 9, reference numeral 51 designates a non-linear A-D convertor circuit, having a resolution of N bits as a whole in which the attenuated signal $V_{INi}$ generated by the array of voltage dividing resistors R and the reference voltage Vri generated by the array of reference resistors r are compared at the comparator CCi and the result of comparison is output via the encoder 52 and the output control circuit 53.

Here the array of voltage dividing resistors R comprises a series connection of n voltage dividing resistors $R_{Ai}$ (i=1, 2, 3 ..., n). The array of voltage dividing resistors attenuates the input signal $V_{IN}$ by a predetermined degree with the result that n+1 attenuated signal $V_{INi}$ ($V_{IN0}$ through $V_{INn}$) are supplied to each comparator CCi (CC0, CC1, CC2 ..., CCn).

In addition, the array of reference resistors r comprises a series connection of n reference resistors $r_{Di}$ (i=1, 2, 3 ..., n) which divides the reference potentials $V_{REFT}$ and $V_{REFB}$ into n+1 reference voltages Vr ($Vr_{D1}$ through $Vr_{Dn}$) to be supplied to the other input end of the comparator CCi.

To each array of a voltage dividing resistors R and each array of reference resistors r are connected current sources I11 and I12. The whole circuit is so constituted that at the common connecting point a voltage fall occurs that in proportion to the resistance value of resistors $R_{Ai}$ and $r_{Di}$.

Here the conditions shown in the following equations are required to be satisfied so that the result of comparison by the comparators CCi are made non-linear and the input dynamic range is made to one half level.

$$r_{D1}+r_{D2}+r_{D3}+\ldots+r_{Dn}=2\times(R_{1B}+R_{2B}+R_{3B}+\ldots+R_{nB}) \quad (2)$$

$$R_{A(i+1)}=\alpha R_{Ai}(i=1, 2, \ldots, n-1) \quad (3)$$

At this time, the resistance ratio $\alpha$ determining each resistance value of respective voltage dividing resistors Ri can be determined by substituting the equation (2) with the equation (3).

When the equation (2) is substituted with the equation (3), the following result is given.

$$\begin{aligned}
R_{A1}+R_{A2}+R_{A3}+\ldots+R_{An} &\quad (4)\\
= R_{A1}(1+\alpha+\alpha^2+\ldots+\alpha^n) &\\
= R_{A1}\times\frac{\alpha^n-1}{\alpha-1} &\\
= \frac{1}{2}(r_{D1}+r_{D2}+r_{D3}+\ldots+r_{Dn}) &
\end{aligned}$$

In this particular embodiment, the resistance value for respective reference resistors $r_{Di}$ (i=1, 2 ..., n) is equal. Consequently when the value is set to $r_{D1}$, the equation (4) can be modified in the following way.

$$R_{A1}\times\frac{\alpha^n-1}{\alpha-1}=\frac{1}{2}nr_{D1} \quad (5)$$

When one end is equal to the resistance value of the voltage dividing resistor $R_{A1}$ and the reference resistor $r_{D1}$ are equal to each other, the item of the resistance value can be eliminated from both sides of the equation (5).

Thus the following equation (6) is established.

$$\frac{\alpha^n-1}{\alpha-1}=\frac{n}{2} \quad (6)$$

In order to determine the value for the resistance ratio $\alpha$ is represented in the following equation in the following way by using an unknown number $\beta$.

$$\alpha=1+\beta \quad (7)$$

At this time when the nth power of the resistance ratio $\alpha$ is determined to the second term by using an expansion of the unknown number $\beta$, the following equation (8) is given.

$$\alpha^n=1+n\beta+\frac{n^2}{2}\times\beta^2 \quad (8)$$

When the equation (6) is simplified by using the equation (8), the following equation (9) is given.

$$\frac{\alpha^n-1}{\alpha-1}=\frac{n\beta+\frac{n^2}{2}\beta^2}{\beta}=n+\frac{n^2}{2}\beta=\frac{n}{2} \quad (9)$$

which comprises an unknown number $\beta$ and a constant n.

When the unknown number $\beta$ is determined by simplifying the equation (9), the following equations (10) and (11) is given.

$$\frac{n^2}{2}\beta=-\frac{n}{2}, \quad \beta=-\frac{1}{n} \quad (10)$$

Thus it has been made clear that when the equation (10) substitutes the equation (7), the resistance ratio only has to be determined as shown in the following equation (11).

$$\alpha = 1 - \frac{1}{n} \quad (11)$$

Consequently in the case of A-D convertor circuit 51 having a 3 bit resolution, to allow the voltage dividing resistor R and the reference resistor r to satisfy the conditions of the equation (1) and the equation (2), only eight resistance values have to be connected to each other which gradually decreases at a ratio of 7/8 (=1−1/8).

Next, the behavior and effect of the embodiment will be explained.

With respect to the above construction, description will be given to two cases; one in which the resistance ratio α of the voltage dividing resistor $R_{Ai}$ is 1 and other cases.

Figure 10:
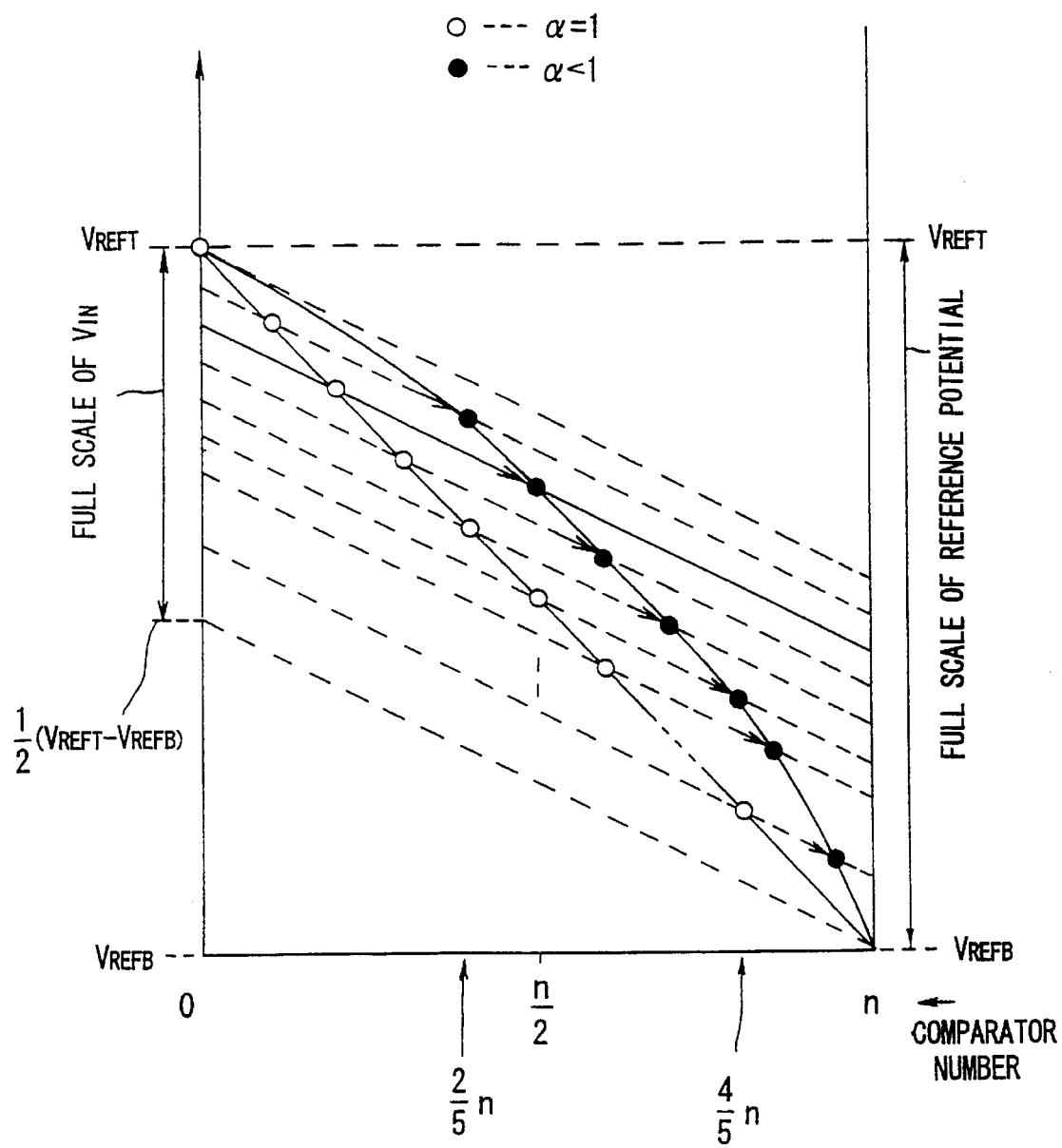
FIG. 10 is a graph for explaining the operation of the A-D converter of FIG. 9.

When the resistance ratio α is 1, n voltage dividing resistors $R_{Ai}$ are inclined at the rate of one half of the input signal $V_{INi}$ with respect to the reference potentials $V_{Ri}$ (a straight line connecting the reference potential $V_{REFT}$ and $V_{REFB}$ in FIG. 10) which generates the array of reference resistor r and attenuated at a preselected ratio.

Thus respective attenuated signals $V_{INi}$ entered into respective comparators CCi is all included within the scope of one half of the full scale (namely $V_{REFT}$−$V_{REFB}$) of the reference potential with respect to the highest attenuated signal $V_{IN0}$ with the result that each attenuated signals $V_{INi}$ that have been compressed into a linear configuration.

Consequently respective attenuated signals $V_{INi}$ in a case where the input signal $V_{IN}$ transforms in the dynamic range, the positions of the comparators CCi that intersect the reference voltages $V_{REFi}$ (the position being designated with a white circle in FIG. 10) successively travel from the left upper corner to the right lower corner on a straight line designating the inclination of the reference voltage in accordance with a decrease in the input signal $V_{IN}$. When the input signal $V_{IN}$ is reduced to one half of the full scale of the reference voltage, the crossing points travel to the right lower corner.

Thus by setting the resistance ratio α of the voltage dividing resistors $R_{Ai}$ to a constant value and the resistance values of all the reference resistors $r_{Di}$ to one half of the resistance value, the dynamic range of the input signal $V_{IN}$ entered into the A-D convertor circuit 51 can be only one half of the reference potential. As a consequence, the load on the amplification step for amplifying the input signal $V_{IN}$ and the S/N ratio is largely improved than before.

On the other hand, when the resistance ratio α of the voltage dividing resistor R assumes a value less than 1, the input signal $V_{IN}$ is successively attenuated by n voltage dividing resistors $R_{Ai}$. The potential of the attenuating signals $V_{INn}$ which are outputted from the dividing resistors $R_{An}$ of n-th steps become a potential lower by one half of the full scale of the reference potential (namely $V_{REFT}$−$V_{REFB}$) than the potential of the input signal $V_{IN}$ of the input signal in the same manner as a case in which the resistance ratio α assumes a value of 1.

By the way, since the resistance values of the voltage dividing resistors $R_{Ai}$ are set in such a manner that it decreases isometrically in accordance with an increased number of steps, a curve depicted by the attenuated signal attenuated signal $V_{INi}$ output from the middle point of connection of respective voltage dividing resistors $R_{Ai}$ form a concave form to the downward direction.

Consequently, the position of the comparator CCi where the attenuated signal $V_{INi}$ become larger than the reference voltages $V_{REFi}$ relative to the potential of the input signal $V_{IN}$ for the first time move toward a larger side compared with a case where the resistance ratio α assumes 1.

The relationship between the size of the input signal $V_{IN}$ at this time and a position where the generated attenuated signals $V_{INi}$ become larger than the reference voltages $V_{REFi}$ will be represented by using black circles as the position of the comparator CCi. When the black circle is represented on a straight line where the attenuated signals $V_{INi}$ are arranged in case where the resistance ratio α assumes 1, the conversion curve forms a concave curve as shown in FIG. 10.

In this case it has been made clear that the position where the level of the attenuated signals $V_{INi}$ and the reference potentials $V_{REFi}$ shift when the resistance ratio α assumes a value less than 1 moves from the position of a white circles (n/10, 2n/10, . . . , n/2, . . . ) on a straight line when the resistance ratio α assumes 1 to the position of black circles (4n/10, n/2, . . . , 8n/10, . . . ) on a curve to provide a non-linear input output characteristic.

By decoding the input signal $V_{IN}$ with this characteristic curve, the digital data output from the output circuit 53 becomes the same output as a decoded signal formed by compressing the input signal $V_{IN}$ into a non-linear configuration.

Besides the dynamic range of the input signal $V_{IN}$ entered into the A-D convertor circuit 51 at this time can be only one half of the reference voltage. Thus the load of the amplification step that amplifies the input signal $V_{IN}$ can be reduced, and S/N ratio can be considerably improved more than before.

In accordance with the above construction, by setting into an isometric relationship of the resistance ratio α the resistance values of the voltage dividing resistor array r supplied to comparators CCi by attenuating the input signal $V_{IN}$, the input signal $V_{IN}$ is compressed into a non-linear configuration to give the same conversion result as a case in which A-D conversion is effected.

This can eliminate the D-A convertor circuit and the compression circuit required for the conventional A-D convertor circuit from the inside of the integration circuit thereby further reducing the circuit area.

Since it is not necessary to send back the output signal to the input side, the construction is suitable for a high speed process and the timing control can be facilitated.

Next, the other embodiments of this invention will be explained.

With the second embodiment, it is described a case in which the input signal $V_{IN}$ entered into the A-D convertor circuit is equivalently expanded twice. However, the present invention is not limited to this, but the invention can be widely applied to a case where the input signal $V_{IN}$ is expanded by a voluntary magnification rate.

With the third embodiment further, it is described a case in which the whole value of resistance of the voltage dividing resistor array R that attenuates the input signal $V_{IN}$ is set to one half of the whole resistance value of reference resistor array r. However, the present invention is not limited to this, but the value can be set to a voluntary ratio.

With the fourth embodiment still further, it is described a case in which the resistance values of the voltage dividing resistor $R_{Ai}$ are set so that the values stand in an isometric relation to a variable i. However, the present invention is not limited to this but, the voltage dividing resistors can be set so that these can be given in a relationship of other function such as an exponential function, a secondary function.

With the fifth embodiment still further, it is described a case in which the resistance values of the voltage dividing resistors $R_{Ai}$ are made small relative to the resistance value of the reference resistors $r_{Di}$ and the input signal $V_{IN}$ is equivalently expanded to perform A-D conversion. However, the present invention is not limited to this, but the resistance values of the voltage dividing resistors $R_{Ai}$ can be made large relative to the resistance values of the reference resistors $r_{Di}$. The input signal $V_{IN}$ can be equivalently compressed to perform A-D conversion.

With the sixth embodiment still further, it is described a case in which the input signal $V_{IN}$ is expanded into a non-linear configuration over a whole range thereof to perform A-D conversion. However, the present invention is not limited to this, but the input signal $V_{IN}$ can be expanded into a non-linear configuration only in a partial range and can be expanded in a linear configuration in other range to perform A-D conversion.

With the seventh embodiment still further, it is described a case in which the same current is allowed to flow to the rated current sources I11 and I12 respectively connected to the voltage dividing resistor array R and the reference resistor array r. However, the present invention is not limited to this, but a voluntary ratio of current can be allowed to flow.

With the eighth embodiment still further, it is described a case in which the present invention is applied to a parallel array type A-D convertor circuit. However, the present invention is not limited to this, but it can be applied to A-D convertor circuit of other type.

As described above, the present invention can realize an analog-to-digital converting circuit with a even smaller circuit area by entering an input analog signal to a plurality of resistors connected in series, attenuating the input signal with a non-linear voltage gradient via this resistor array and comparing a attenuating analog signal that has been attenuated with a reference voltage to which a preselected voltage gradient is given.

Next, the ninth embodiment of this invention will be explained.

Figure 11:
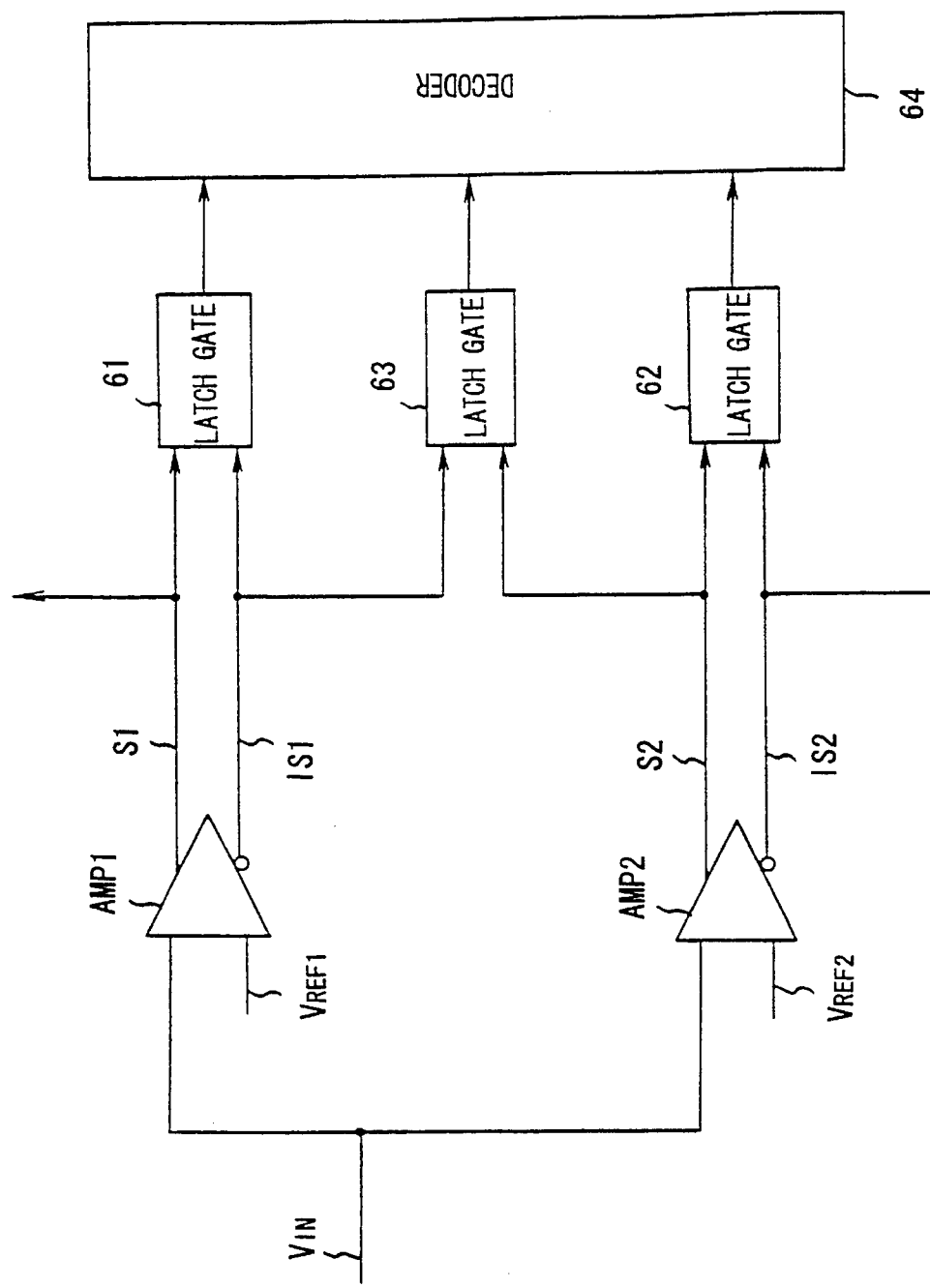
FIG. 11 is a diagram showing the construction of an interpolation comparator using for the A-D converter of this invention.

Before this invention will be explained, the principle of comparison output interpolation using complementary output will be explained using FIG. 11.

The comparison output of the analog input signal $V_{IN}$ corresponding to a virtual potential bisectional between two reference potentials is obtained by comparing the in-phase output of the initial differential pair of one comparator with the reverse phase output of the initial differential pair of another neighboring comparator.

Here, it will be explained how to obtain the relative output of the analog input signal $V_{IN}$ corresponding to a virtual potential $V_{VIRT}$, as a potential intermediate between two reference potentials $V_{REF1}$ and $V_{REF2}$ in reference to FIG. 11.

Differential amplifiers AMP1 and AMP2 form respectively the initial differential pair of comparators constituting an analog-to-digital converter and differentially amplify the reference potentials $V_{REF1}$ and $V_{REF2}$ applied to one input terminal and the analog input signal $V_{IN}$ applied to the other input terminal.

Figure 12A:
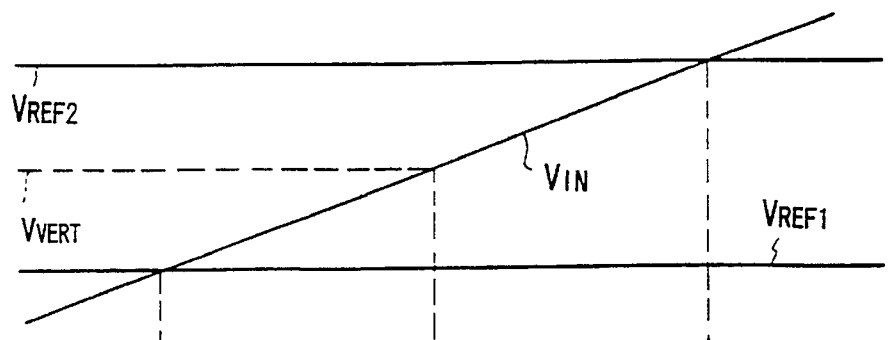
FIGS. 12A and 12B are diagrams for explaining the operation of a comparator.
Figure 12B:
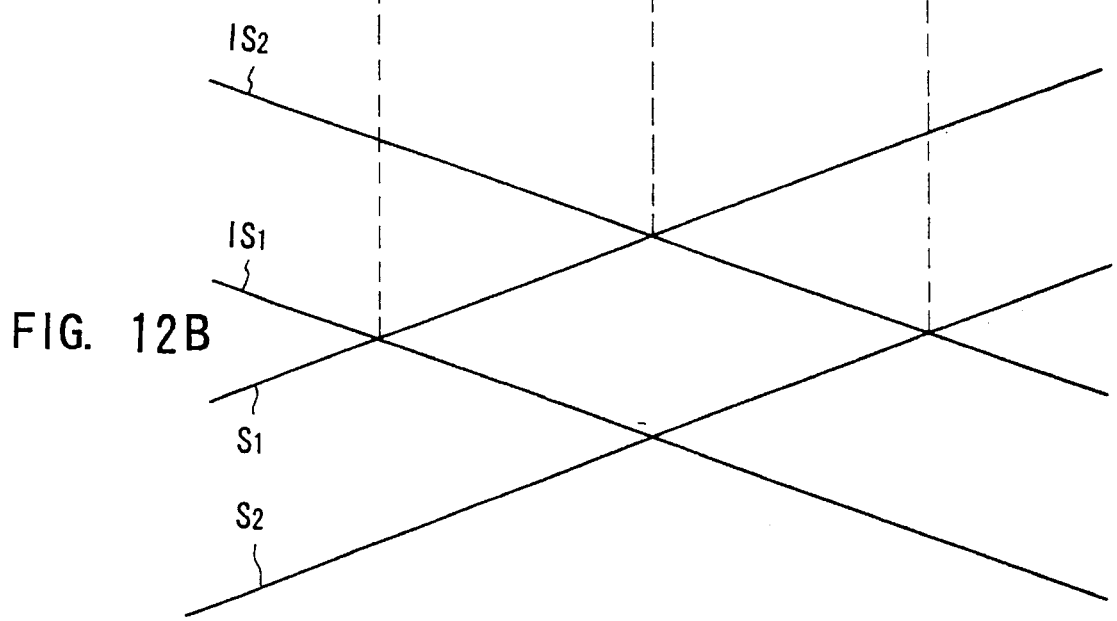

The analog-to-digital converter latches comparative output either high or low by applying the in-phase output S1 and the reverse phase output IS1 of differential amplifier AMP1 to a latch gate 61, and latches comparative output either high or low by applying the in-phase output S2 and the reverse phase output IS2 of differential amplifier AMP2 to a latch gate 62, as shown in FIG. 12B.

Thereby, the analog-to-digital converter draws a comparison of the analog input signal $V_{IN}$ with the reference potentials $V_{REF1}$ and $V_{REF2}$.

Moreover, the analog-to-digital converter latches comparative output either high or low according to the relation between two signals by applying the reverse phase output IS1 of differential amplifier AMP1 and the in-phase output S2 of differential amplifier AMP2 to a latch gate 63, and outputs the comparative output to a decoder The output of the latch gate 63 is inverted at a potential intermediate between the reference potential $V_{REF1}$, where the output of the latch gate 61 is inverted and the reference potential $V_{REF2}$, where the output of the latch gate 62 is inverted, as will be seen from FIG. 12B.

This means that the comparison output of the analog input signal $V_{IN}$ corresponding to a virtual potential $V_{VERT}$, bisectional between two reference potentials $V_{REF1}$ and $V_{REF2}$, can be obtained from the output of the latch gate 63, as shown in FIG. 12A.

Thereby, the number of initial stage differential pairs of comparators which are applied reference potentials can be thinned out to half the number of comparators required by resolution, whereby a considerable reduction in circuit area can be brought about compared with the case where the comparators depending on resolution are all integrated.

Next, the overall composition of the ninth embodiment will be explained.

Figure 13:
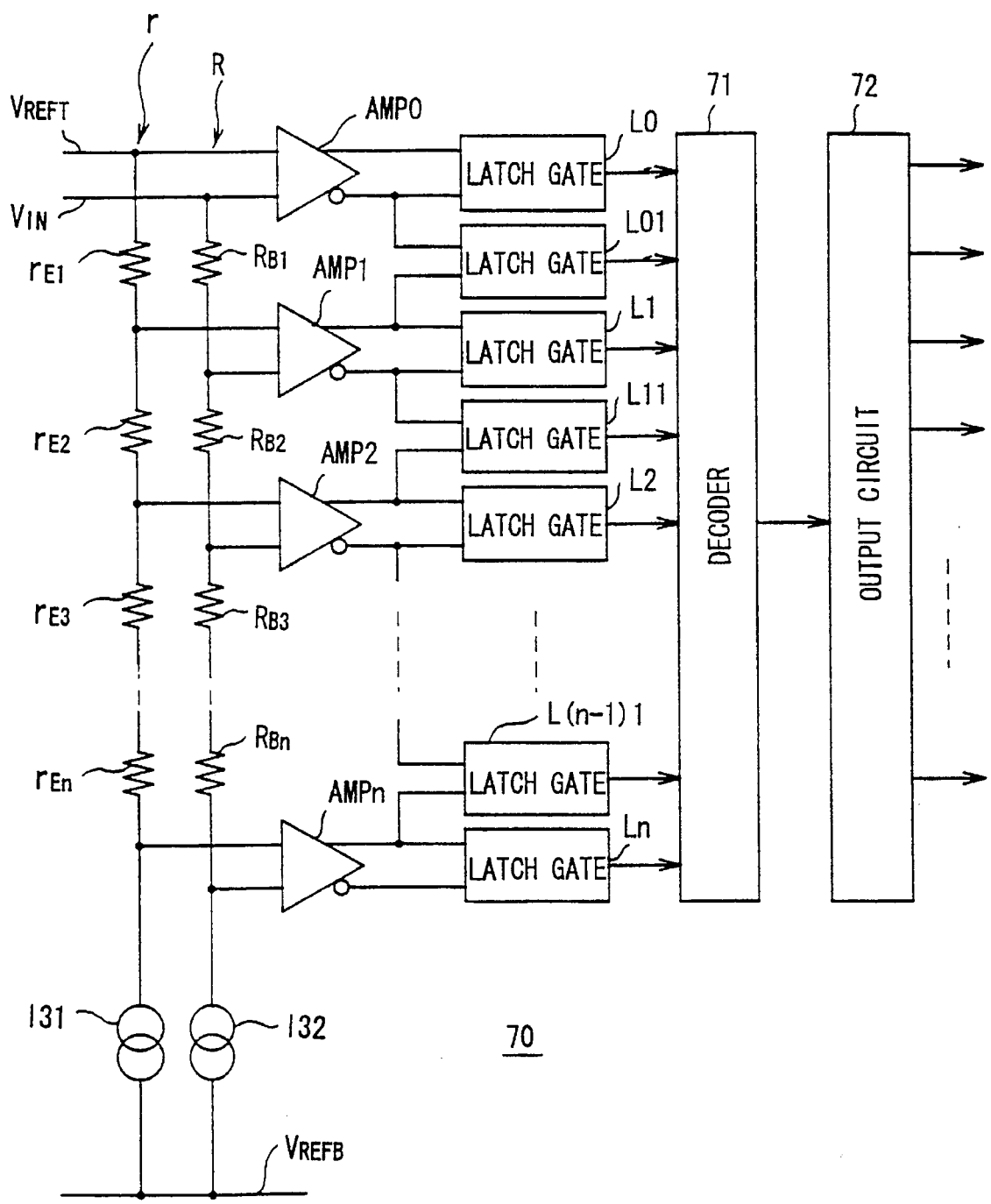
FIG. 13 is a diagram showing the construction of an A-D converter in ninth embodiment according to this invention.

FIG. 13 shows a parallel type analog-to-digital converter 70 with a resolution of N bits, which is so constructed as to convert an analog input signal $V_{IN}$ into digital data by applying the above-stated two principles.

The analog-to-digital converter 70 inputs an attenuated input signal $V_{IN}$ into respective differential amplifiers AMPi (i=0, 1, 2, ..., n) forming the initial stage differential pair of comparators and also inputs differential output pairs from respective differential amplifiers AMPi (i=0, 1, 2, ..., n). The in-phase output and reverse phase output of differential amplifiers AMPi and AMPi+1 (i=0, 1, 2, ..., n−1) neighboring to each other into latch gates Li (i=0, 1, 2, ..., n) and Li1 (i=0, 1, 2, ..., n−1).

Therein, the analog-to-digital converter 70 generates reference potentials $V_{REFi}$ (i=0, 1, 2, ..., n), lowering with a predetermined voltage gradient respectively across n reference resistors $r_{Ei}$ (i=0, 1, 2, ..., n) connected between two reference potentials $V_{REFT}$ and $V_{REFB}$. This array of reference resistors r is connected to current source I31 supplying constant current.

The analog-to-digital converter 70 also generates attenuated signals $V_{INi}$ (i=0, 1, 2, ..., n) as attenuated versions of the input signal $V_{IN}$, with different voltage gradients as against reference potentials $V_{REFi}$ respectively across an array of n voltage dividing resistors $R_{Bi}$ (i=0, 1, 2, ..., n) connected between two reference potentials $V_{REFT}$ and $V_{REFB}$. The resistance of voltage dividing resistors $R_{Bi}$ are set at half as much as the resistance of reference resistors $r_{Ei}$.

The current value of current source I32 supplying the array of the voltage dividing resistors R with constant current is then set at the same current value as current source I31 which is connected with the array of the reference resistors r, whereby the analog-to-digital converter 70 can equivalently double the amplitude of the input signal $V_{IN}$.

Moreover, the analog-to-digital converter 70 supplies differential amplifiers AMPi with the attenuated signals $V_{INi}$ and the reference potentials $V_{REFi}$ generated respectively across the array of the voltage dividing resistors R and the array of the reference resistors r, and apply the differential output of attenuated signals $V_{INi}$ corresponding to the respective reference potentials $V_{REFi}$ to latch gates Li (i=0, 1, 2, ..., n).

The analog-to-digital converter 70 then obtains from neighboring differential amplifiers the reverse phase outputs of differential amplifiers AMPi whose reference potentials are higher than that of the divided voltages and the in-phase outputs of the other differential amplifier AMPi+i whose reference potentials are lower than that of the divided voltages one of two neighboring differential amplifiers to latch gates Li1 (i=0, 1, 2, ..., n–1) arranged between latch gates Li.

Thereby, the analog-to-digital converter 70 is enabled to specify where in between reference potentials to invert the relation of attenuated signals $V_{INi}$ with reference potentials and further to judge whether the potentials of the attenuated signals $V_{INi}$ thus specified are above or below the virtual reference potentials $V_{VERTi}$ (i=0, 1, 2, ..., n–1), approximately bisectional between the reference potentials. The analog-to-digital converter 70 then behaves apparently as if there were as many comparators as 2n+1.

The analog-to-digital converter 70 outputs to the output circuit 72 a value corresponding to the potential where the potential of the attenuated signal $V_{INi}$ becomes greater than the reference potential $V_{REFi}$ or the virtual potential $V_{VERTi}$ for the first time when the latch output of each latch gate L is input to the decoder 71, and then outputs digital data corresponding to the input signal $V_{IN}$ from the output circuit 72.

Next, the behavior and advantages of embodiment will be explained.

The following describes the conversion operation of the analog-to-digital converter 70 when the potential of the input signal $V_{IN}$ input to the analog-to-digital converter 70 in the composition described above is a little greater in potential than three fourths of the full scale.

This potential is very close to the median of the full scale of the input signal $V_{IN}$, and a boundary reference potential at which the comparative relation of differential output is inverted in the central differential amplifier of the n+1 differential amplifiers.

Letting this boundary reference potential be $V_{REFm}$, the logical value of the latch output at latch gate L(m–1)1 which is given to decoder 71 is inverted according to whether or not the attenuated signal $V_{INm}$ is higher than the virtual potential $V_{VIRT(m-1)}$ set nearly at the midpoint between two neighboring reference potentials $V_{REFm}$ and $V_{REF(m-1)}$.

Accordingly, where the logical value is inverted by the latch output of this latch gate L(m–1)1, it is evident that the potential of the attenuated signal $V_{INm}$ is closer to the lower reference potential $V_{REFm}$ of the two reference potentials.

Where the logical value is not inverted by the latch output of the latch gate L(m–1)1, on the other hand, it is judged that the potential of the attenuated signal $V_{INm}$ is closer to the higher reference potential $V_{REF(m-1)1}$ of the two reference potentials.

The analog-to-digital converter 70 can thus convert the input signal $V_{IN}$ into digital data with sharper resolution using a virtual potential (actually not existent) $V_{VIRTi}$ as reference potential and hence provides even higher accuracy.

The analog-to-digital converter 70 in the above-described construction can equivalently double the amplitude of the input signal $V_{IN}$ by attenuating the input signal $V_{IN}$ through the array of the voltage dividing resistors R, and inputting the attenuated signals $V_{INi}$ thus attenuated to the differential amplifiers AMPi to draw a comparison with the reference potentials $V_{REFi}$, whereupon the amplitude of the input signal $V_{IN}$ may be lowered with the result of an improvement in signal-to-noise ratio.

Moreover, the analog-to-digital converter 70 can substantially reduce the number of elements in relation to resolution by latching through inputting the reverse phase differential output components of the differential output of two neighboring differential amplifiers to the latch gates.

Next, the tenth embodiment of this invention will be explained.

The concrete circuit construction of the principle of comparison output interpolation by dividing complementary output current will be explained.

In the ninth embodiment, the differential outputs of differential amplifiers are used as it is, and then the comparison outputs of a virtual potential bisectional between two reference potentials and an attenuated signal are formed by comparing the reverse phase differential output components out of the differential voltage outputs of two neighboring differential amplifiers with each other. For the tenth embodiment, virtual potentials quadrisectional and more precisely isotomic between two reference potentials are realized by dividing the differential currents of differential amplifiers.

In the case of tenth embodiment, the comparison outputs of a plurality of virtual potentials intermediate between two reference potentials and attenuated signals $V_{INi}$ are determined by comparing composite currents as a total obtained by adding the in-phase output of one differential amplifiers AMPi to which attenuated signals $V_{INi}$ and reference potentials $V_{REFi}$ are supplied and the in-phase output of another differential amplifiers AMPi+1 to which attenuated signals $V_{INi}$ and neighboring reference potentials $V_{REFi+1}$ (=$V_{REF1}$+$\Delta V$) are supplied together in a predetermined proportion with the reverse phase output of either amplifiers AMPi or AMPi+1.

Figure 14:
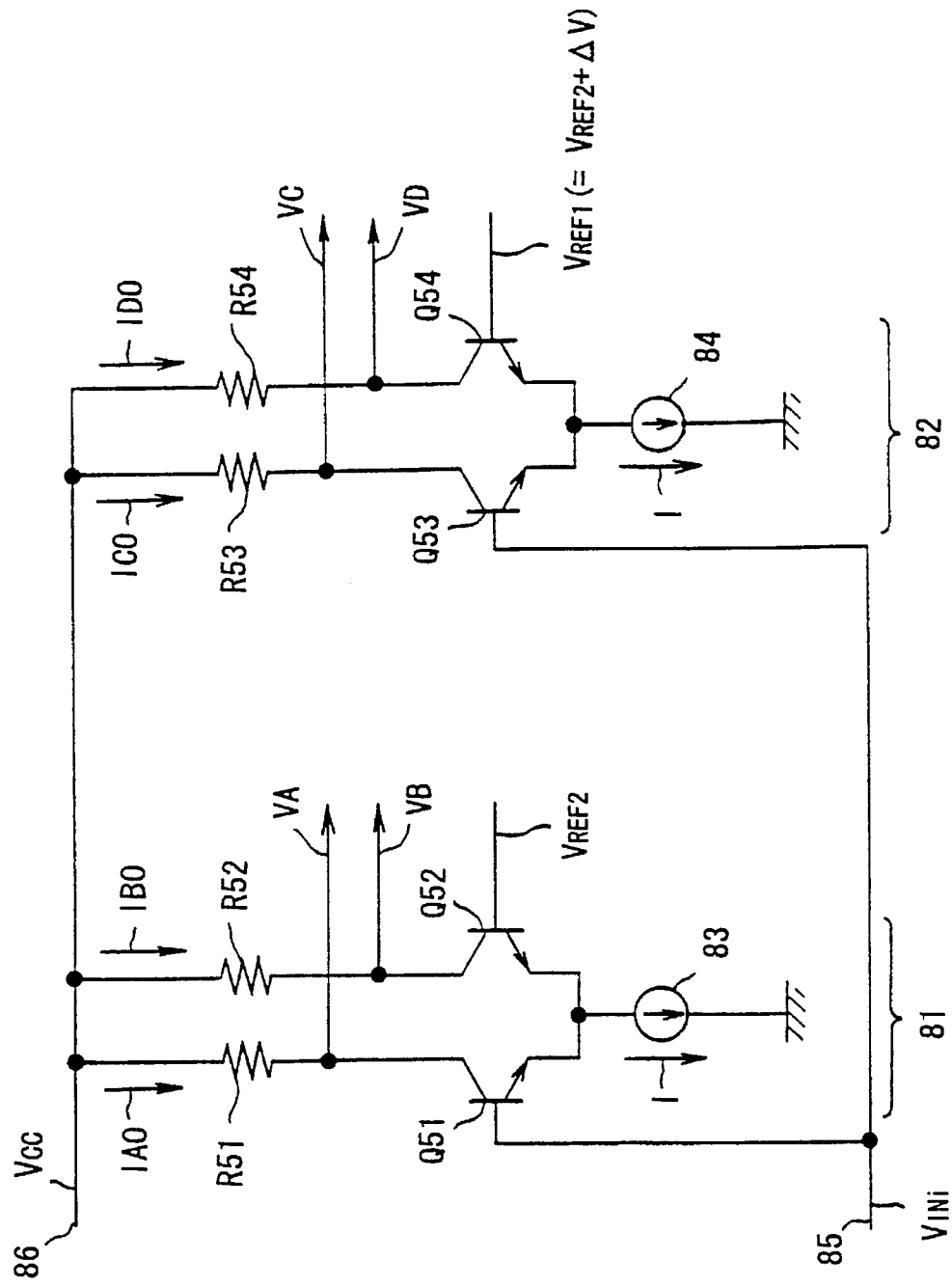
FIG. 14 is a basic circuit diagram of a comparator using for the A-D converter of FIG. 13.

The following explains this principle by using two sets of differential pairs 81 and 82 as shown in FIG. 14. Therein, the differential pair 81 consists of transistors Q51 and Q52, to the bases of which an attenuated signal $V_{INi}$ and a reference potential $V_{REF2}$ are supplied. The differential pair 82, on the other hand, consists of transistors Q53 and Q54, to the bases of which an attenuated signal $V_{INi}$ and a reference potential $V_{REF1}$ are supplied.

Figure 15:
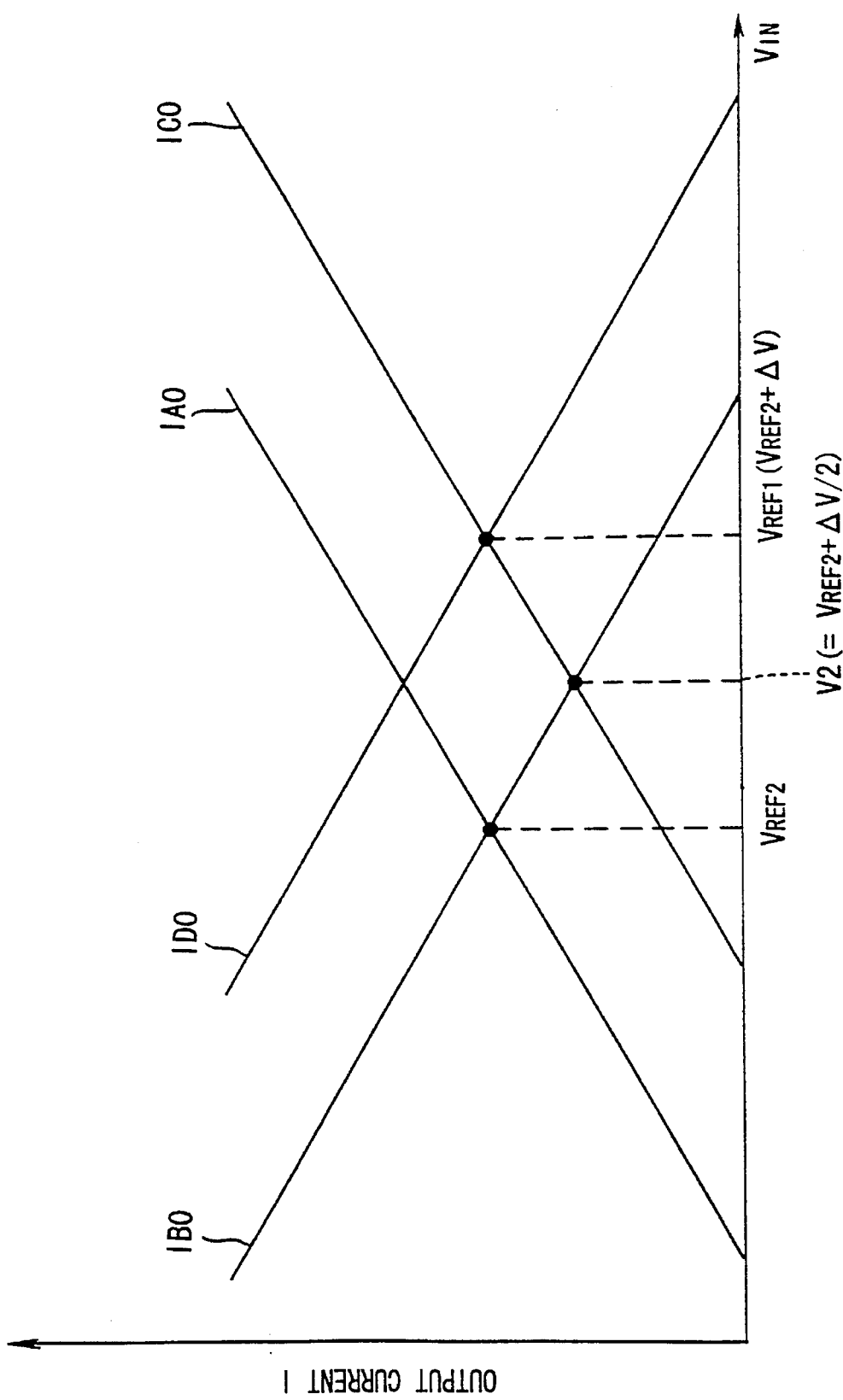
FIGS. 15 to 18 are diagrams for explaining the operation of the comparator of FIG. 14.

Letting the collector currents then flowing through transistors Q51, Q52, Q53, and Q54 be IA0, IB0, IC0, and ID0, respectively, the current values of the respective collector currents IA0, IB0, IC0, and ID0 are inverted respectively at reference potentials $V_{REF2}$ and $V_{REF1}$ as shown in FIG. 15.

Accordingly, the comparison output of the attenuated signal $V_{INi}$ corresponding to the reference potential $V_{REF2}$ can be obtained by comparing by a comparator the output voltages VA and VB, developing at the connection nodes of load resistors R51 and R52 and transistors Q51 and Q52 through which the collector currents IA0 and IB0 flow.

Also, the comparison output of the attenuated signal $V_{INi}$ corresponding to the reference potential $V_{REF1}$ can be obtained by comparing by a comparator in which the output voltages VC and VD develop at the connection nodes of load resistors R53 and R54 and transistors Q53 and Q54 through which the collector currents IC0 and ID0 flow.

Similarly, the collector currents IA0 and ID0 are inverted at an intermediate potential $V_{REF2}+\Delta V/2$ between the reference potentials $V_{REF2}$ and $V_{REF1}$ (=$V_{REF2}+\Delta V$), and the collector currents IB0 and IC0 are inverted at an intermediate potential $V_{REF2}+\Delta V/2$, between the reference potentials $V_{REF2}$ and $V_{REF1}$. Hence, the comparison output of the attenuated signal $V_{INi}$ corresponding to the virtual potential $V_{REF2}+\Delta V/2$ can be obtained by comparing the output voltages VA and VD, or the output voltages VB and VC, by a comparator.

Suppose that the comparison output of attenuated signals $V_{INi}$ corresponding to virtual potentials quadrisectional between two reference potentials $V_{REF2}$ and $V_{REF1}$ (=$V_{REF2}+\Delta V$) are obtained by using this relationship.

In this case, three collector currents IA0, IB0, and IC0 are used.

Figure 16:
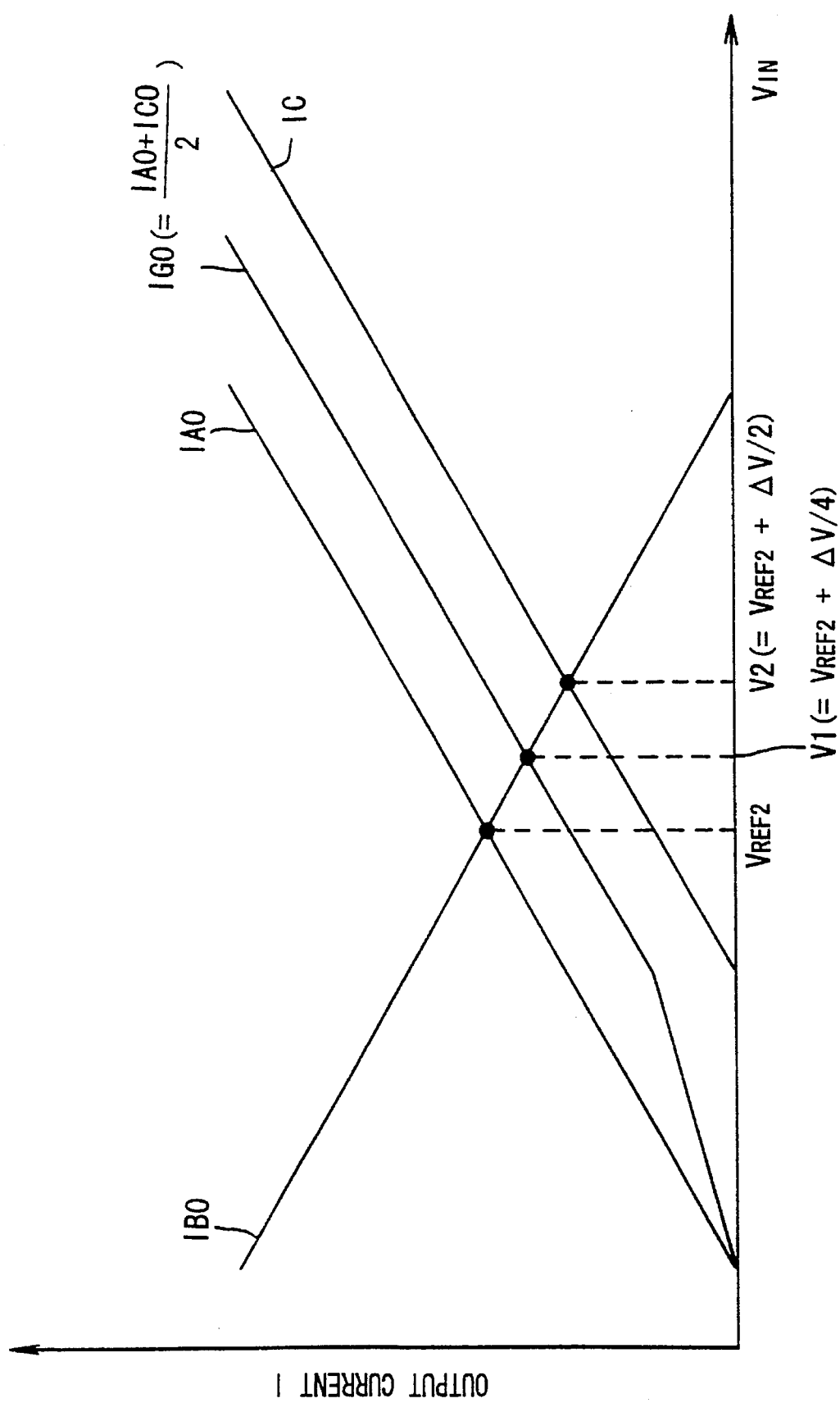

In as much as there is a characteristic relation between voltage differences and collector currents such that collector currents increase or decrease linearly within the range where voltage differences are smaller, the collector currents IA0 and IC0, as the respective in-phase output of the differential pairs 81 and 82 increase or decrease almost in parallel to each other as shown in FIG. 16, and thus the collector current IB0, as the reverse phase output of the differential pair 81 intersects within a basically linear range.

Therefore, if a composite collector current IG0 (=IA0/2+ IC0/2) can be generated by adding the collector currents IA0 and IC0 together respectively in the proportion of 1/2, the composite collector current IG0 is represented by a straight line at an equal distance from both collector currents IA0 and IC0 and running in parallel to both collector currents IA0 and IC0, so that the collector current IB0 and the composite collector current IG0 are inverted at the virtual potential V1 (=$V_{REF2}$+$\Delta V$/4), quadrisectional between the reference potentials $V_{REF2}$ and $V_{REF1}$.

Therefore, the comparative output of a attenuated signal $V_{INi}$ corresponding to the virtual potential V1 (=$V_{REF2}$+$\Delta V$/4) can be obtained by comparing the output voltage VB, induced by the collector current IB0, with the output voltage VG induced by the composite collector current IG0.

Figure 17:
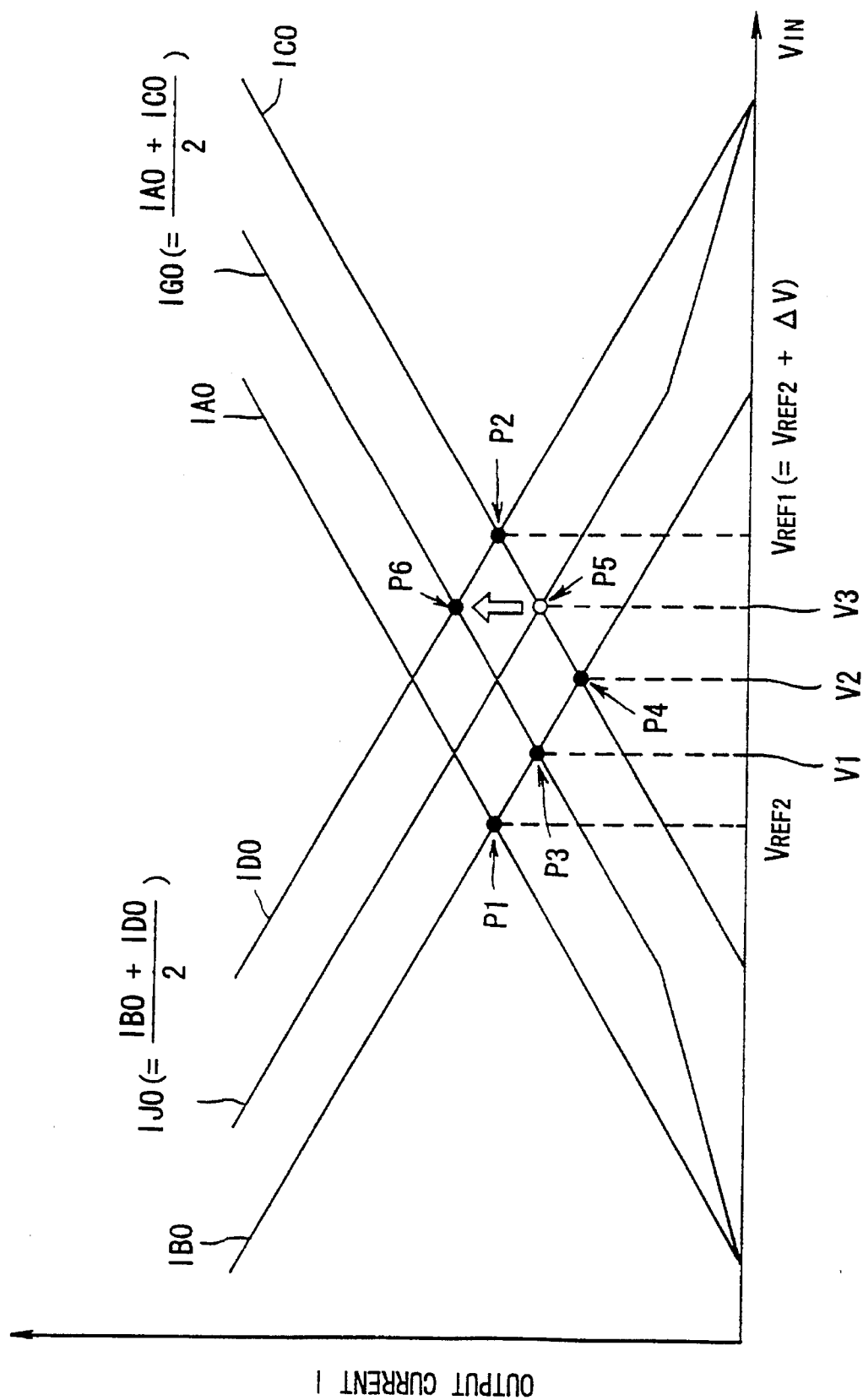

In as much as a similar relation holds good for the three collector currents IA0, IB0, and ID0 as well, the comparison output of an attenuated signal $V_{INi}$ corresponding to the virtual potential V3 (=$V_{REF2}$+3·$\Delta V$/4) can be obtained by generating a composite collector current IJ0 (=IB0/2+ID0/2) obtained by adding the collector currents IB0 and ID0 together respectively in the proportion of 1/2 and then comparing an output voltage VC induced by the collector current IC0, with an output voltage VF induced by the composite collector current IJ0 (See FIG. 17).

Again, the comparison output of an attenuated signal $V_{INi}$ corresponding to the virtual potential V3 which is obtained by comparing the composite collector current IJ0 with the collector current IC0, may also be determined by using the composite collector current IG0 used in the comparison of an attenuated signal $V_{INi}$ corresponding to the virtual potential V1.

Figure 18:
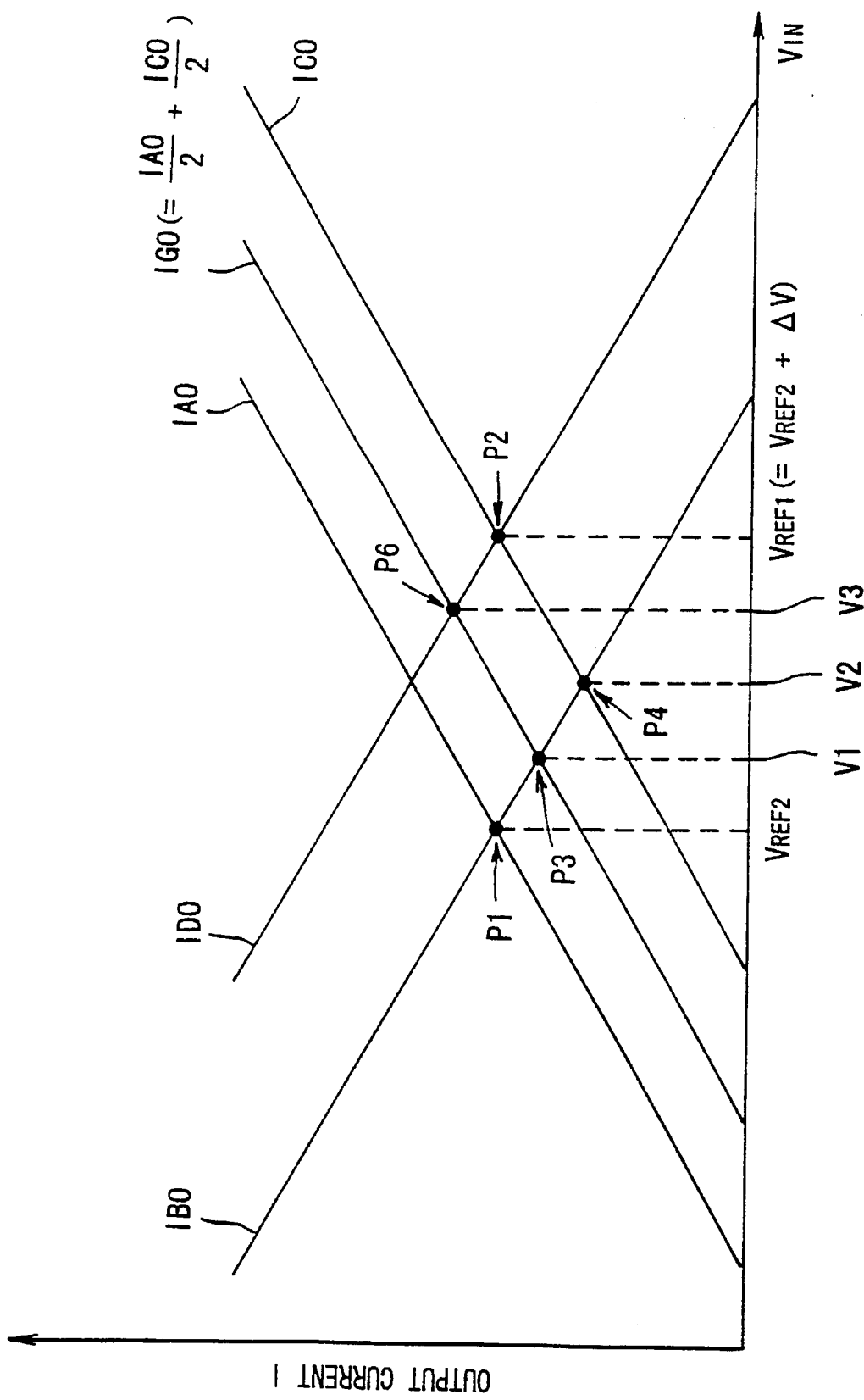

That is, the comparison output of an attenuated signal $V_{INi}$ corresponding to the virtual potential V3 can be obtained by comparing an output voltage induced by the composite collector current IG0 with an output voltage induced by the collector current ID0, as shown in FIG. 18.

Thus, in this embodiment, the comparison output of attenuated signals $V_{INi}$ corresponding to the virtual potentials V1, V2, and V3 quadrisectional between two reference potentials $V_{REF2}$ and $V_{REF1}$, is interpolated on the principle of comparing a composite collector current IG0 or IJ0 which is obtained by adding the in-phase output IA0 and IC0 (or else IB0 and ID0) together in the proportion of 1/2 respectively with the collector currents IB0 and ID0 (or else IA0 and IC0).

The overall composition of embodiment will be hereinafter explained.

Figure 19:
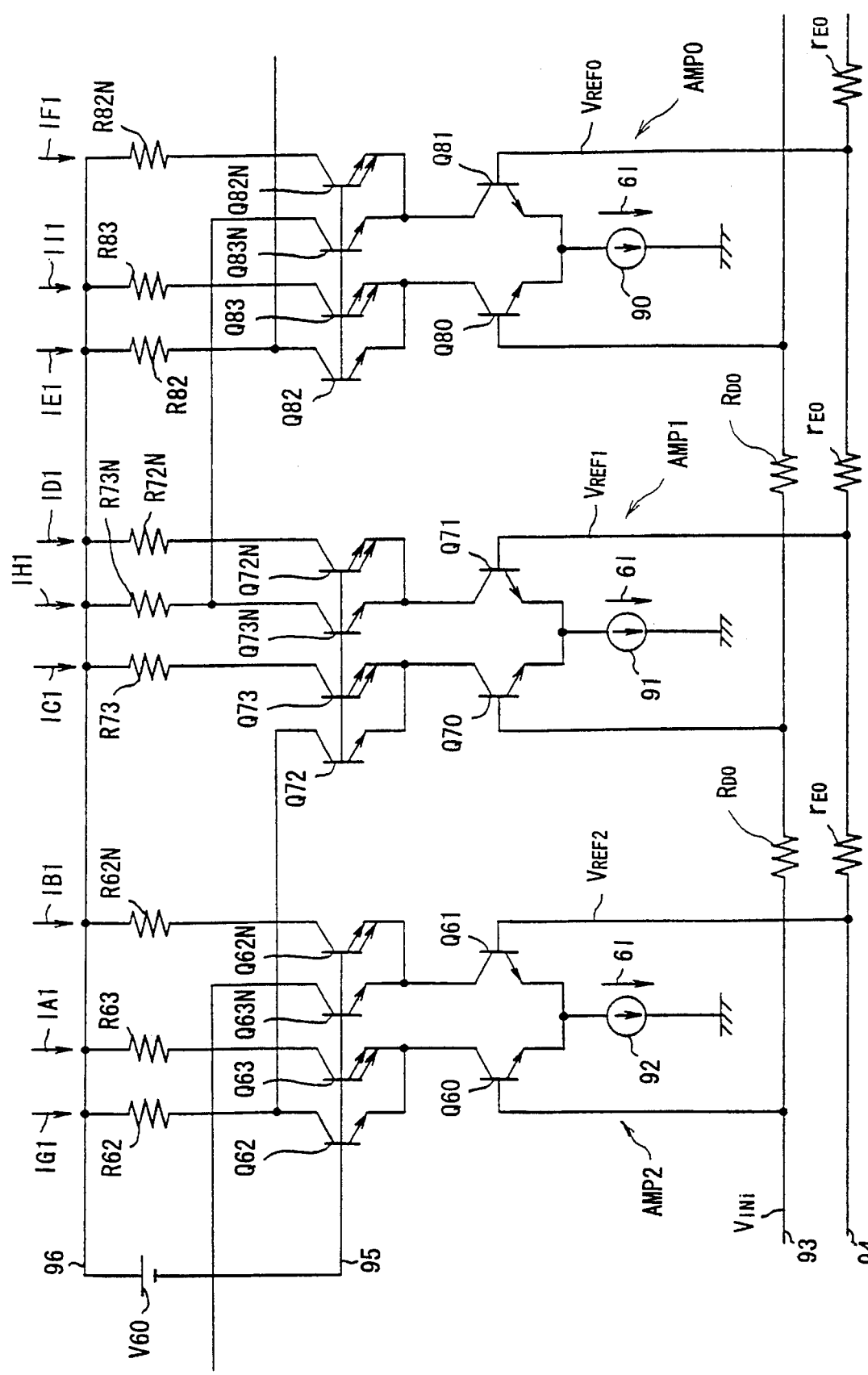
FIG. 19 is a circuit diagram of a comparator in the tenth embodiment according to this invention.

For this embodiment, the analog-to-digital converter supplies an attenuated signals $V_{INi}$ attenuated by an array of resistors R to differential amplifiers AMPi, determining a plurality of voltage values by dividing differential currents as results of comparison with reference potentials, and converting these voltage values into digital data through latch gate and a decoder. FIG. 19 shows the basic composition of the quadrisectional interpolation type comparator of an analog-to-digital converter based on this principle.

This comparator divides collector currents at a current ratio of 1:2 as the comparison output of the reference potentials $V_{REF1}$, $V_{REF2}$, and $V_{REF3}$, and then combines and adds them together, whereby the comparison output of attenuated signals, $V_{INi}$, corresponding to virtual potentials quadrisectional between reference potentials, $V_{REF1}$, $V_{REF2}$, and $V_{REF3}$ is obtained.

Differential amplifiers AMP2, AMP1, and AMP0 constituting the comparator each have a similar reference potentials, $V_{REF2}$, $V_{REF1}$, and $V_{REF0}$ are composition, wherein attenuated signals, $V_{INi}$, and the applied respectively to transistors Q60, Q70, and Q80 on the one hand and transistors Q61, Q71, and Q81 on the other hand, which respectively form differential pairs, and thus collector currents according to the signal levels of attenuated signals, $V_{INi}$, corresponding to the respective reference potentials are led into the respective differential pairs.

Therein, the collectors of transistors Q60 and Q61, transistors Q70 and Q71, and transistors Q80 and Q81, each of which set forms a differential pair, are cascade-connected respectively to three common-base dividing transistor sets, (Q62, Q63, Q63N, Q62N), (Q72, Q73, Q72N, Q73N), and (Q82, Q83, Q83N, Q82N), whose emitter area ratio is set at 1:2, so that comparative collector currents should be divided according to the emitter area ratio.

Moreover, each differential pair of the neighboring differential pairs is so constructed as to connect in common the connectors of the dividing transistor sets (Q62, Q72) and (Q73N, Q83N), whose collector currents are divided to a third, and as to obtain an output voltage by composing two sets of composite collector currents in an reverse phase relation with each other.

Thereby, letting the divided collector currents of transistors Q63 and Q73 be IA1 and IC1 respectively, a composite collector current IG1 (=IA1/2+IC1/2), obtained by combining the divided collector currents IA1 and IC1, each in the proportion of 1/2 flows through load resistor R62 connected to the common collectors of transistors Q62 and Q72.

Similarly, letting the divided collector currents of transistors Q72N and Q82N be ID1 and IF1 respectively, a composite collector current IH1 (=ID1/2+IF1/2) obtained by combining the divided collector currents ID1 and IF1 each in the proportion of 1/2 flows through load resistor R73N connected to the common collectors of transistors Q73N and Q83N.

In as much as the dividing transistor sets (Q62, Q63, Q62N), (Q72, Q73, Q72N) and so forth, are connected respectively to the load resistor sets (R62, R63, R62N), (R72, R73, R72N) and so forth, and output voltage corresponding to the current values of divided collector currents divided according to the emitter area ratio of these transistors and each composite collector current is obtained across each load resistor.

For this embodiment, comparison output corresponding to a virtual potential quadrisectional between two reference potentials $V_{REF2}$ and $V_{REF1}$, is obtained by comparing the output voltage developing across one load resistor with that developing across another load resistor.

That is, the comparison output of attenuated signals $V_{INi}$ corresponding to two reference potentials $V_{REF2}$ and $V_{REF1}$, is obtained by comparing the output voltage across load resistor R63 with that across load resistor R62N, and the output voltage across load resistor R73 with that across load resistor R72N.

Also, the comparison output of an attenuated signal $V_{INi}$ corresponding to a virtual potential V2 (=$V_{REF2}$+$\Delta V$/2) bisectional between two reference potentials $V_{REF2}$ and $V_{REF1}$ can be obtained by comparing the output voltage across load resistor R62N with that across had resistor R73.

Furthermore, the comparison output of an attenuated signal $V_{INi}$ corresponding to a virtual potential V1 (=$V_{REF2}$+ $\Delta V/4$) bisectional between the reference potential $V_{REF2}$, and the intermediate potential V2 or quadrisectional between the reference potentials $V_{REF2}$ and $V_{REF1}$ can be obtained by comparing the output voltage across load resistor R62 through which the composite collector current IG1 flows with the output voltage across load resistor R63 through which the divided collector current IB1 flows.

Similarly, the comparison output of an attenuated signal $V_{INi}$ corresponding to another virtual potential V3 (=$V_{REF2}$+3 $\Delta V/4$), bisectional between the reference potential $V_{REF1}$ and the intermediate potential V2 or quadrisectional between the reference potentials $V_{REF2}$ and $V_{REF1}$, can be obtained by comparing the output voltage across load resistor R62 through which the composite collector current IG1 flows with the output voltage across load resistor R72N through which the divided collector current ID1 flows.

Thus, the comparison output of attenuated signals $V_{INi}$ corresponding to the virtual potentials V1 and V3 quadrisectional between the reference potentials $V_{REF2}$ and $V_{REF1}$, can be obtained by comparing the composite collector current IG1 in phase with the attenuated signal $V_{INi}$ with the collector currents IB1 and ID1, in an reverse phase relation to the attenuated signal $V_{INi}$.

Figure 20:
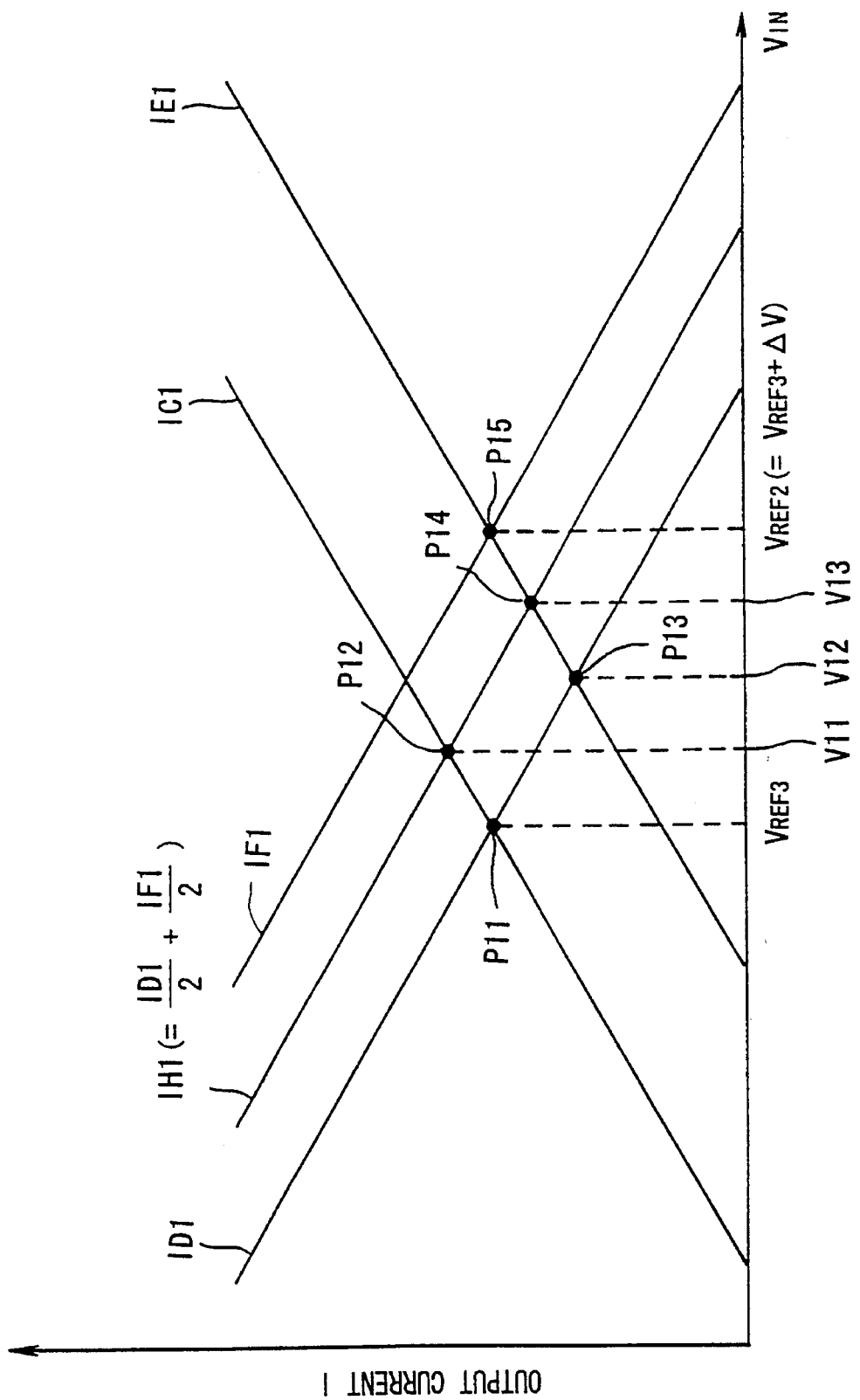
FIG. 20 is a diagram for explaining the operation of the comparator of FIG. 19.

On the other hand, the comparison output of attenuated signals $V_{INi}$ corresponding to two virtual potentials V11 and V13 quadrisectional between two reference potentials $V_{REF1}$ and $V_{REF0}$, adjacent to the reference potentials $V_{REF2}$ and $V_{REF1}$, can be obtained by comparing the composite collector current IH1 in a reverse phase relation to the attenuated signal $V_{INi}$ with the collector currents, IC1 and IE1, in a reverse phase relation to the attenuated signal $V_{INi}$ (see FIG. 20).

Next, the behavior and advantages of embodiment will be explained.

The following explains how the analog-to-digital converter in the above construction performs conversion operations when the potential of the input signal $V_{IN}$ is a little lower than the maximum potential $V_{REFT}$.

It is assumed here that the input signal $V_{IN}$ is then enlarged on the principle of full-scale enlargement by resistive division, and the relation between attenuated signals $V_{INi}$ input to differential amplifiers AMPi and reference potentials is inverted at a certain reference potential $V_{REF3}$.

It follows that such an attenuated signal $V_{INi}$ assumes any potential between intermediate between two reference potentials $V_{REF3}$ and $V_{REF2}$.

Also, it is by comparison between output voltages across load resistors that can determine which of the virtual potentials V11, V12, and V13 quadrisectional between two reference potentials $V_{REF3}$ and $V_{REF2}$, induces an inversion of the relation between attenuated signals $V_{INi}$ input to differential amplifiers and reference potentials.

For instance, if the logical value of comparison output is inverted by the comparison output of the output voltages across the load resistor R63 through which the divided collector current IA1 flows and across load resistor R62N through which the divided collector current IB1 flows, then the attenuated signal $V_{INi}$ must be at a potential a little higher than the reference potential $V_{REF3}$ and lower than the virtual potential V11 (at the intersection point P12, in FIG. 20).

Also, if the logical value of comparison output is inverted by the comparison output of the output voltages across the load resistor R73 through which the divided collector current IC1 flows and across load resistor R73N through which the divided collector current IH1 flows, then the attenuated signal $V_{INi}$ must be at a potential higher than the virtual potential V11 and lower than the virtual potential V12 (at the intersection point P13, in FIG. 20).

Similarly, it can be discriminated that the potential of an attenuated signal $V_{INi}$ lies between the virtual potential V13 and the virtual potential V14 (the intersection point P14, in FIG. 20), and also lies between the virtual potential V14 and the reference potential $V_{REF2}$ (the intersection point P15, in FIG. 20).

Thus, the analog-to-digital converter can convert the input signal $V_{IN}$ into digital data with fourfold resolution compared with an actually generated reference potential $V_{REF}$.

The analog-to-digital converter in the above construction can equivalently double the amplitude of the input signal $V_{IN}$, because the input signal $V_{IN}$ is attenuated through the array of voltage dividing resistors R, and the attenuated signal $V_{INi}$ thus attenuated is input to the differential amplifiers AMPi to draw comparisons with reference potentials $V_{REFi}$, whereby the amplitude of the input signal $V_{IN}$ can be reduced with the result of an improvement in signal-to-noise ratio.

Furthermore, the analog-to-digital converter can substantially reduce the number of elements in relation to resolution by dividing differential currents at a predetermined ratio and comparing one output voltage with another induced by composite collector currents obtained by recomposing the divided currents.

Consequently, the power consumption of any semiconductor integrated circuit incorporating such an analog-to-digital converter is reduced compared with that of conventional ICs, and a reduction in chip area as well can be brought about.

Furthermore, this invention facilitates the realization of flash-type analog-to-digital converters with a resolution of ten or more bits, which are suitable for signal processing for high-precision digital display for use in high-quality TV image receivers.

Next, the eleventh embodiment of this invention will be explained.

With the tenth embodiment, it has been described above the case where the voltage gradient of the input signal $V_{IN}$ to be attenuated by voltage dividing resistors is set at half the voltage gradient of reference potentials supplied to each comparator. However, this invention is not limited to this, but may be widely applied also to cases where the voltage gradient of the input signal $V_{IN}$ to be attenuated through voltage dividing resistors is set at greater or less than half the voltage gradient of reference potentials.

Moreover, with the twelfth embodiment, it has been described above the case where the resistance ratio of voltage dividing resistors and reference resistors is set at 1:2 and a constant current source 131 leading in the same constant current I is connected to each array of voltage dividing resistors. However, this invention is not limited to this case alone, but allows the resistance values of voltage dividing resistors and reference resistors to be set at the same value and the ratio of constant current flowing .in the constant current source connected to each voltage dividing resistors array to be set at 1:2.

Next, the thirteenth embodiment of this invention will be explained.

Figure 21:
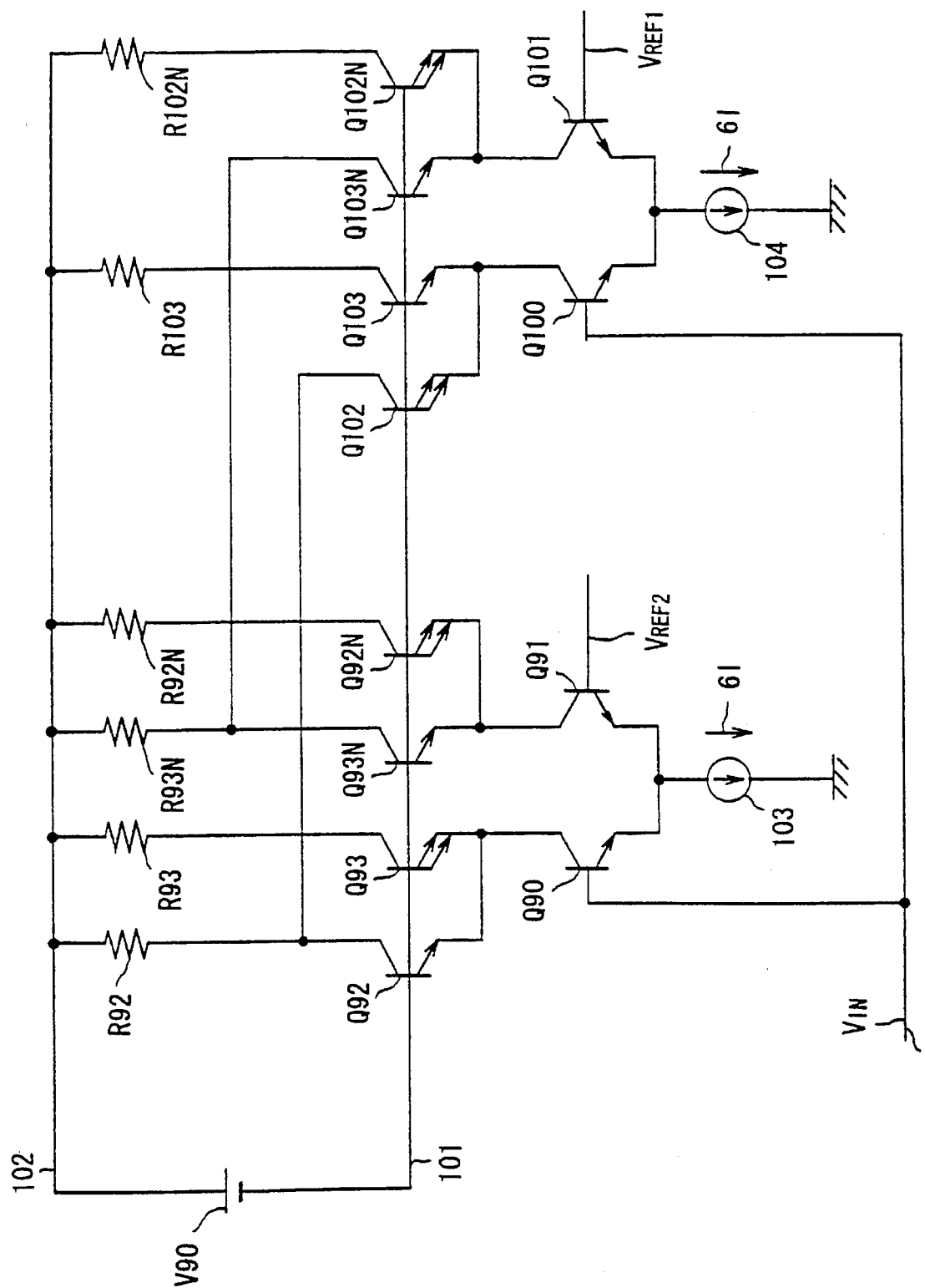
FIG. 21 is a circuit diagram of a comparator in thirteenth embodiment according to this invention.

In the above-described embodiments, it has been described above the case where a circuit for interpolating the differential output of differential amplifiers AMPi by current shunting is composed as shown in FIG. 19. However, this invention is not limited to this case alone, but, as shown in FIG. 21, allows both collector currents of transistors Q102 and Q103N of the divided collector currents divided by the transistor sets (Q102, Q103) and (Q103N, Q102N), to be composed into the collector currents of low-order differential amplifiers.

Next, the fourteenth embodiment of this invention will be explained.

In the above-stated embodiments, it has been described above the case where the differential output of differential amplifiers is interpolated to determine comparison output corresponding to virtual potentials bisectional or quadrisectional between reference potentials. However, this invention is not limited to this case alone, but may be widely applied also in determining comparison output using virtual potentials even more precisely isotomic between reference potentials.

Next, fifteenth embodiment of this invention will be explained.

Furthermore, in the above-described embodiments, it has been described parallel-type analog-to-digital converters. However, this invention is not limited to them alone, but may be brought similar effects also by using other analog-to-digital converters, such as the lowest-order analog-to-digital conversion processor of a serial-parallel analog-to-digital converter.

As has been described so far, this invention enables the full range of analog input signals to be input to an analog-to-digital converter to be less than the full range of reference potentials, and the comparison output of analog input signals corresponding to virtual reference potentials isotomic between reference potentials developing across an array of reference resistors to be obtained, whereby an improvement in signal-to-noise ratio and resolution can be brought about without lowering the potential of the least significant digit and also a reduction in circuit area can be brought about at no cost of resolution.

Figure 22:
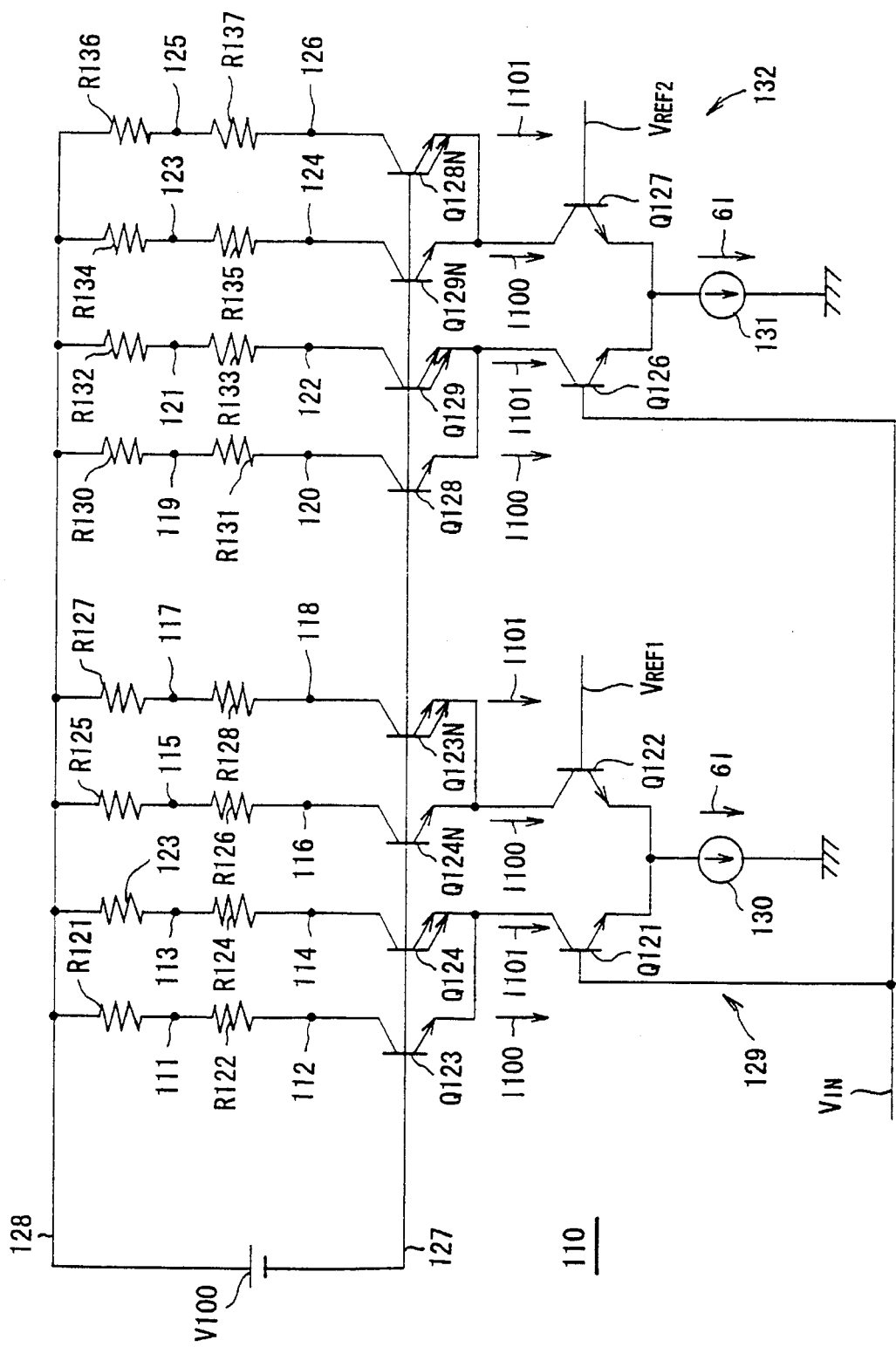
FIG. 22 is a circuit diagram of a comparator in sixteenth embodiment according to this invention.

Next, the sixteenth embodiment of this invention will be described with reference to the accompanying drawings:

In FIG. 22, reference numeral 110 denotes a whole 6-division interpolation type comparator. In the comparator 110, a collector current flowing through a differential amplifier 129 is divided into two currents at a ratio 1:2, and each of the output voltages resulting from the divided collector currents is further halved so that the comparator 110 produces four pairs of in-phase and reversed-phase outputs. The in-phase and reversed-phase outputs of the differential amplifiers 129 and 132 are paired and compared with each other so as to produce comparison outputs with respect to virtual potentials that divide the interval between the reference voltages $V_{REF1}$ and $V_{REF2}$ for the respective differential amplifiers 129 and 132 equally into six.

The differential amplifiers 129 and 132 have the same connection scheme in which an input analog signal $V_{IN}$ is compared with the reference voltage $V_{REF1}$ or $V_{REF2}$ in the first stage differential pair Q121 and Q122, or Q126 and Q127. For example, transistors Q123 and Q124 and transistors Q124N and Q123N, which have different emitter areas, are cascade-connected to the collectors of the transistors Q121 and Q122, respectively, so as to divide the respective differential output currents at a ratio of 1:2.

With the above configuration, collector currents I100 and I101 (=2×I100) that are in-phase with the input analog signal $V_{IN}$ flow through transistors Q123 and Q124, respectively, and collector currents I100N and I101N (=2×I100N) that are in reversed-phase with the input analog signal $V_{IN}$ flow through the transistors Q124N and Q123N, respectively.

In this embodiment, each of the load resistors connected to the collectors of the current-division transistors Q123, Q124, Q124N, and Q123N, respectively, consists of two series resistors having the same resistance (R121, R122), (R123, R124), (R125, R126) or (R127, R128). The two series resistors halve the voltage across the load resistor that is connected to each of the transistors Q123, Q124, Q124N, and Q123N, so as to enable generation of a plurality of output voltages for the input analog signal $V_{IN}$.

For example, output voltages V111 and V112 given by equations (12) and (13):

$$V111 = Vcc - I100 \cdot R121 \quad (12)$$

$$\begin{aligned} V112 &= Vcc - I100 \cdot (R121 + R122) \\ &= Vcc - 2I100 \cdot R121 \end{aligned} \quad (13)$$

appear at a connection node 111 between the resistors R121 and R122 and a connection node 112 between the resistor R122 and the transistor Q123, respectively.

Similarly, output voltages V113 and V114 given by equations (14) and (15):

$$\begin{aligned} V113 &= Vcc - I101 \cdot R123 \\ &= Vcc - 2I100 \cdot R123 \end{aligned} \quad (14)$$

$$\begin{aligned} V114 &= Vcc - I101 \cdot (R123 + R124) \\ &= Vcc - 4I100 \cdot R123 \end{aligned} \quad (15)$$

appear at a connection node 113 between the resistors R123 and R124 and a connection node 114 between the resistor 124 and the transistor Q124, respectively.

As is understood from equations (13) and (14), the output voltages V112 and V113 are equal to each other. Therefore, considering the characteristic that the output voltages vary more or less linearly in the vicinity of the reference voltage $V_{REF1}$ as the comparison potential, it is also understood that the output voltage V112 (or V113) internally divides the two output voltages V111 and V114 at a ratio of 1:2.

On the other hand, output voltages V115 and V116, which vary symmetrically with the output voltages V111 and V112 with respect to the reference voltage $V_{REF1}$, appear at a connection node 115 between the resistors R126 and R125, and at a connection node 116 between the resistor R126 and the transistor Q124N, respectively. The collector current I101N that is in reversed-phase with the input analog signal $V_{IN}$ flows through the connection nodes 115 and 116.

Similarly, output voltages V117 and V118, which vary symmetrically with the output voltages V113 and V114 with respect to the reference voltage $V_{REF1}$, appear at a connection midpoint P117 between the resistors R127 and R128, and at a connection midpoint 118 between the resistor R128 and the transistor Q123N, respectively.

Also in this case, the output voltages V117 and V116 are equal to each other and the output voltage V117 (or V116) internally divides the two output voltages V115 and V118 at a ratio of 1:2.

Figure 23:
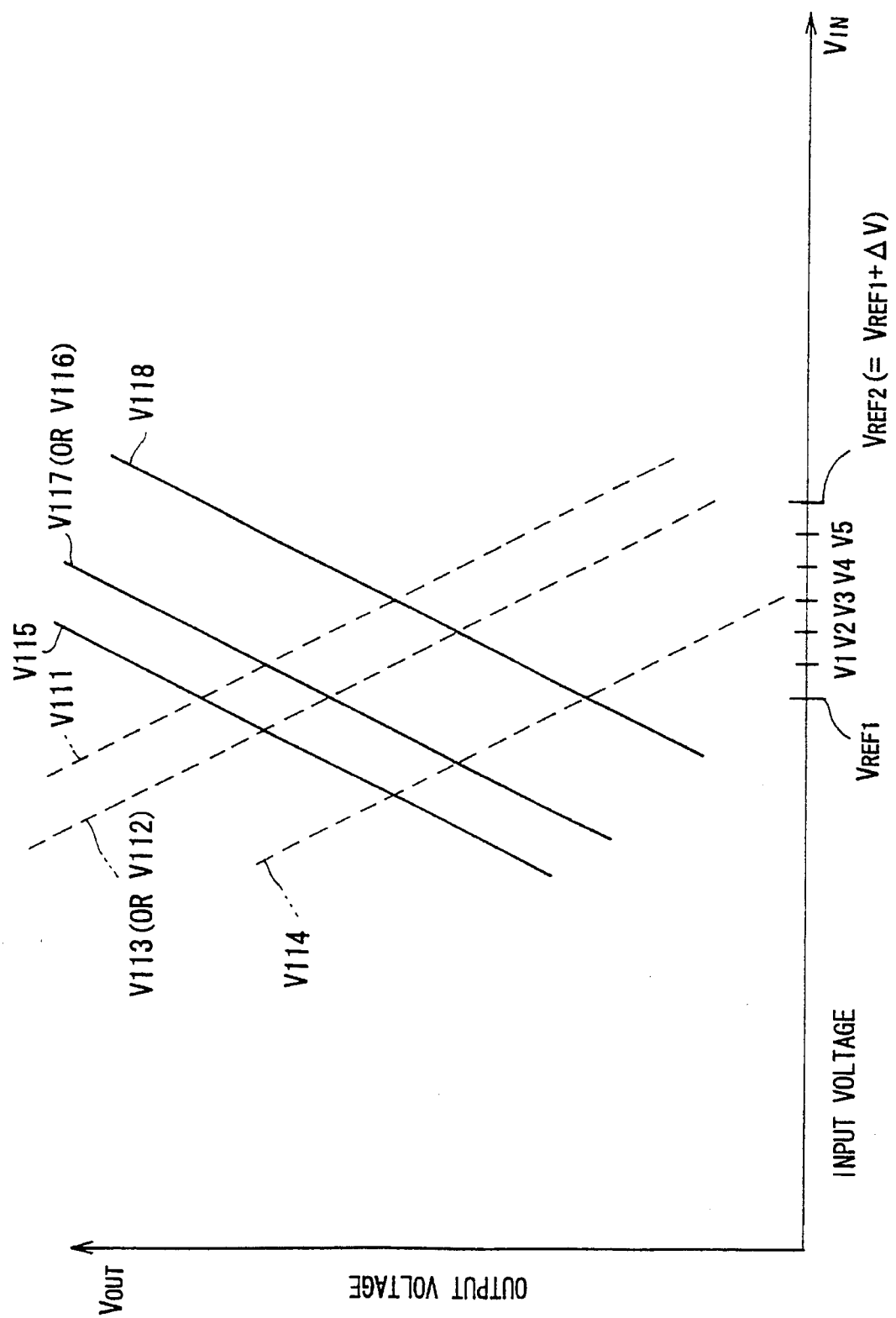

FIG. 23 shows the relationship between the output voltages V113, V114, V117, V118, V111, V112, V115, and V116 and the input analog signal $V_{IN}$.

Figure 25:
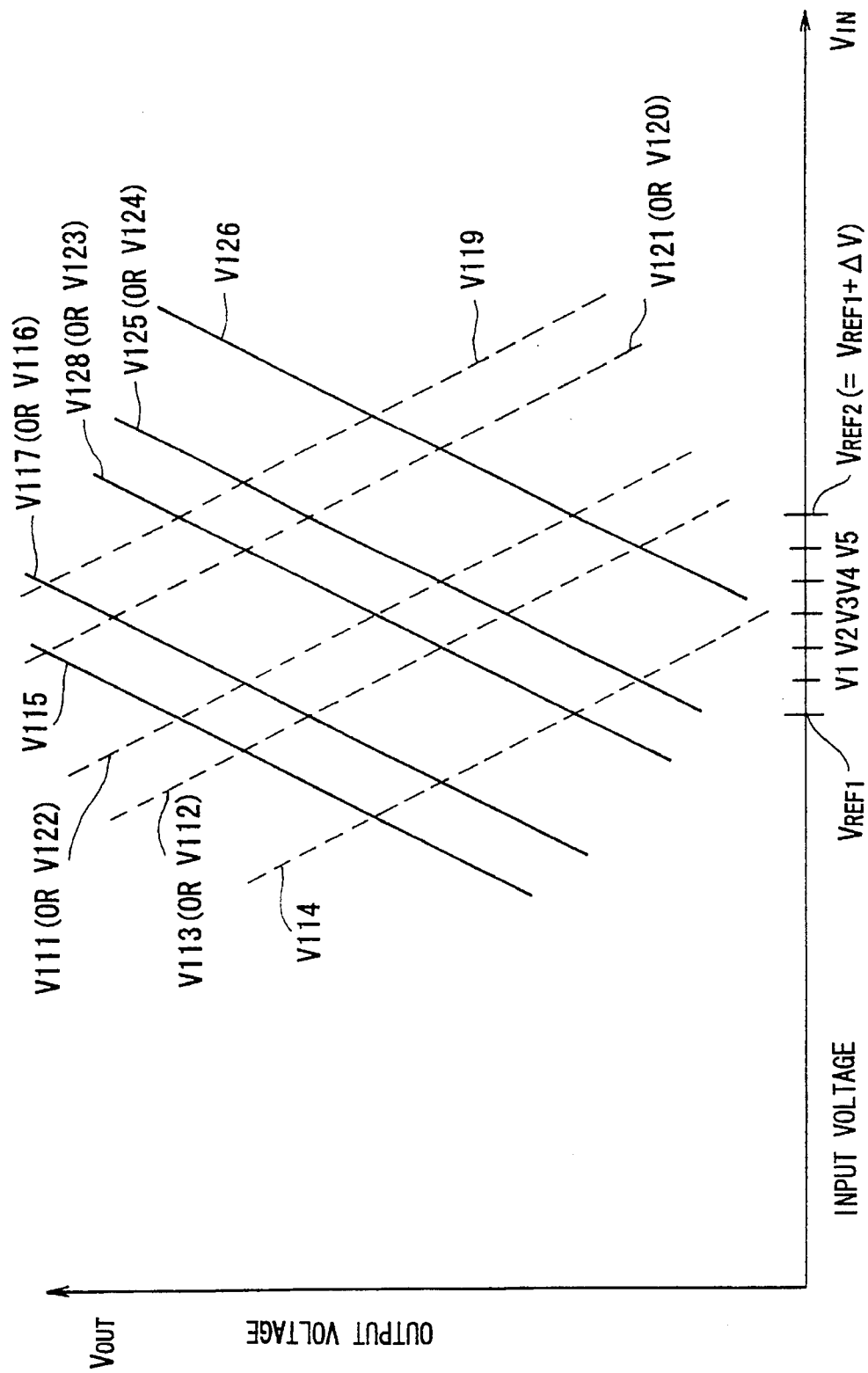

Since the other differential amplifier 132 has the same configuration as the differential amplifier 129, output voltages V121, V122, V125, and V126, and output voltages V119, V120, V123, and V124, which correspond to the output voltages V113 to V118 and V111 to V116 of the differential amplifier 129, vary symmetrically with each other with respect to the reference voltage $V_{REF2}$ (=$V_{REF1}$+ΔV) (see FIG. 25).

Figure 24:
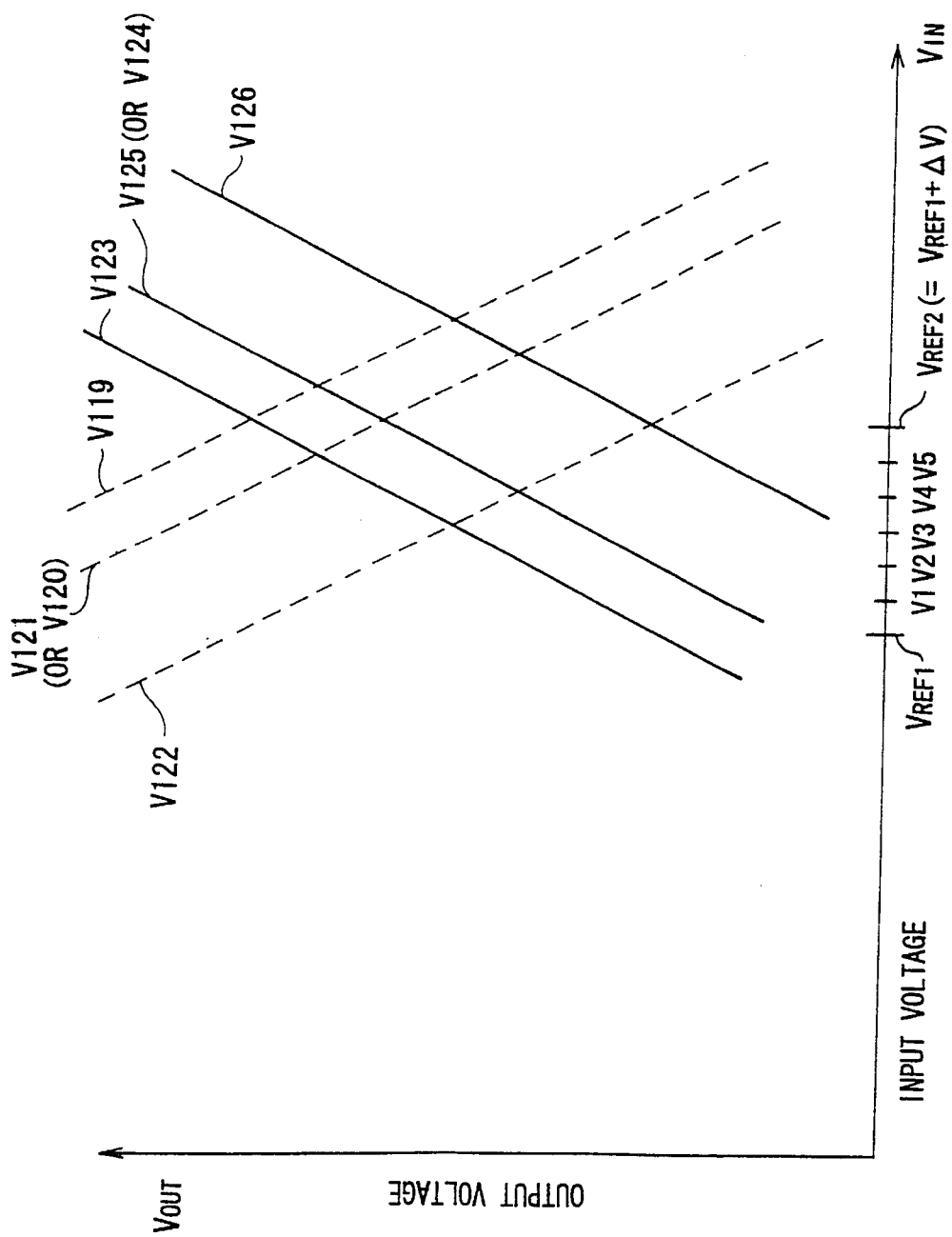

Incidentally, among the output voltages of the differential amplifiers 129 and 132 of this embodiment, the output voltages V112 and V122 are equal to each other (see FIG. 24).

The comparator 110 is so constructed as to produce comparison outputs with respect to imaginary voltages V1 to V5 that equally divide the interval between the two reference voltages $V_{REF1}$ and $V_{REF2}$ into six using the relationship in which the output voltages V113 to V120 internally divide the other output voltages at respective predetermined ratios.

In the above configuration, the comparison outputs of the input signal $V_{IN}$ with respect to the reference voltages $V_{REF1}$ and $V_{REF2}$ and the imaginary voltages V1 to V5 can be obtained through comparison between the output voltages as shown in FIG. 26.

Here, a description is made of the following combinations.

For example, the comparison output with respect to the reference voltage $V_{REF1}$ is obtained by comparing the output voltages V114 and V118, and the comparison output with respect to the imaginary voltage V1 is obtained by comparing the output voltages V114 and V125.

Figure 27:
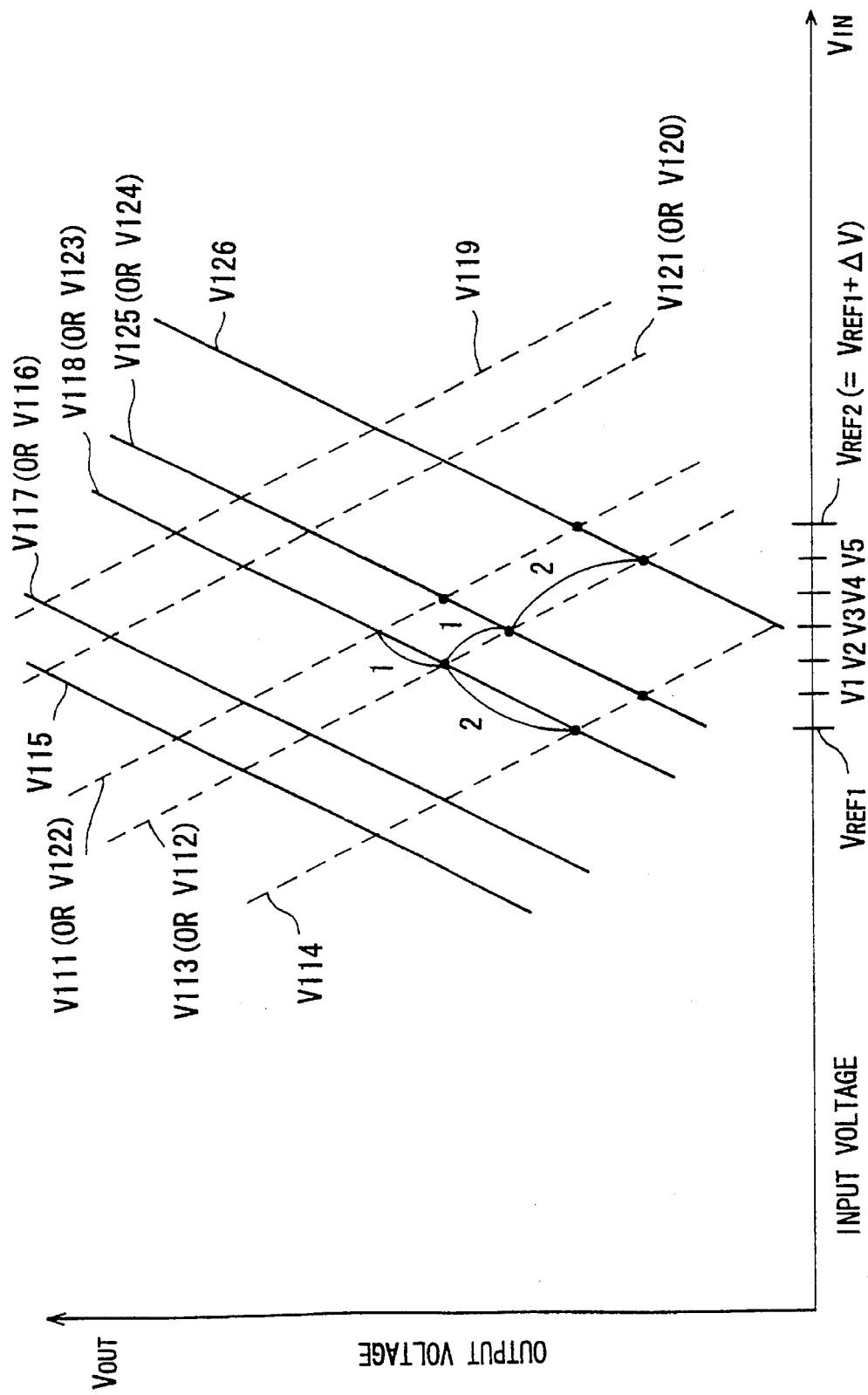

Furthermore, the comparison outputs with respect to the virtual voltages V2 to V5 and the reference Voltage $V_{REF2}$ can, in turn, be obtained by comparing, for instance, the output voltages V113 and V118, V113 and V125, V111 and V125, V113 and V126, and V122 and V126, respectively (see FIG. 27).

First, the comparison output with respect to the virtual voltage V3, which halves the reference voltages $V_{REF1}$ and $V_{REF2}$, is obtained by paying attention to a pair of output voltages V114 and V118 as the comparison outputs with respect to the reference voltage $V_{REF1}$, and another pair of output voltages V122 and V126 as comparison outputs with respect to the reference voltage $V_{REF2}$, among which the output voltages V114 and V126 and the output voltages V118 and V122 cross each other at the center of the two reference voltages.

Then, the comparison output with respect to the virtual voltage V1 is obtained by using the fact that the output voltage V125 (or V124) that crosses the output voltage V114 internally divides the two output voltages V123 and V126 at a ratio of 1:2.

That is, this embodiment uses the fact that the relationship in magnitude between the output voltages V114 and V125 (or V124) is reversed at the voltage that internally divides the reference voltage $V_{REF1}$ and the virtual voltage V3 at a ratio of 1:2 (that is, internally divides the reference voltages $V_{REF1}$ and $V_{REF2}$ at a ratio of 1:6).

Just as in the case of obtaining the comparison output with respect to the imaginary voltage V1, the comparison output with respect to the virtual voltage V5 can be obtained by using the relationship in which the output voltage V113 (or V112) internally divides the output voltages V114 and V111 at a ratio of 2:1.

Furthermore, the comparison output with respect to the virtual voltage V2 can be obtained by using the output voltage V113, the relationship of which in magnitude with the output voltages V125 and V126 is reversed at the virtual voltages V3 and V5, respectively. This is based on that fact that the output voltage V125 (or V124) internally divides the output voltages V123 and V126 at a ratio of 1:2, and that the voltage difference between the voltage at which the output voltages V113 and V123 cross each other and the virtual voltage V3 is a half the voltage difference between the virtual voltages V3 and V5.

Similarly, the comparison output with respect to the virtual voltage V4 is obtained by using the output voltage V117, the relationship of which in magnitude with the output voltages V121 and V122 is reversed at the virtual voltage V1 and V3, respectively. This is based on the relationship in which the output voltage V113 internally divides the output voltages V114 and V122 at a ratio of 2:1.

According to the above configuration, the comparator 110 can produce comparison outputs with respect to the virtual voltages V1 to V5 that divide equally into six the interval between the two reference voltages $V_{REF1}$ and $V_{REF2}$ given to the respective differential amplifiers 129 and 132.

Furthermore, since the resistances of the resistors constituting each load resistor are set at the same value, the difference of the output speed as is caused by the difference of the time constant can be much reduced from that of the conventional comparator.

Figure 28:
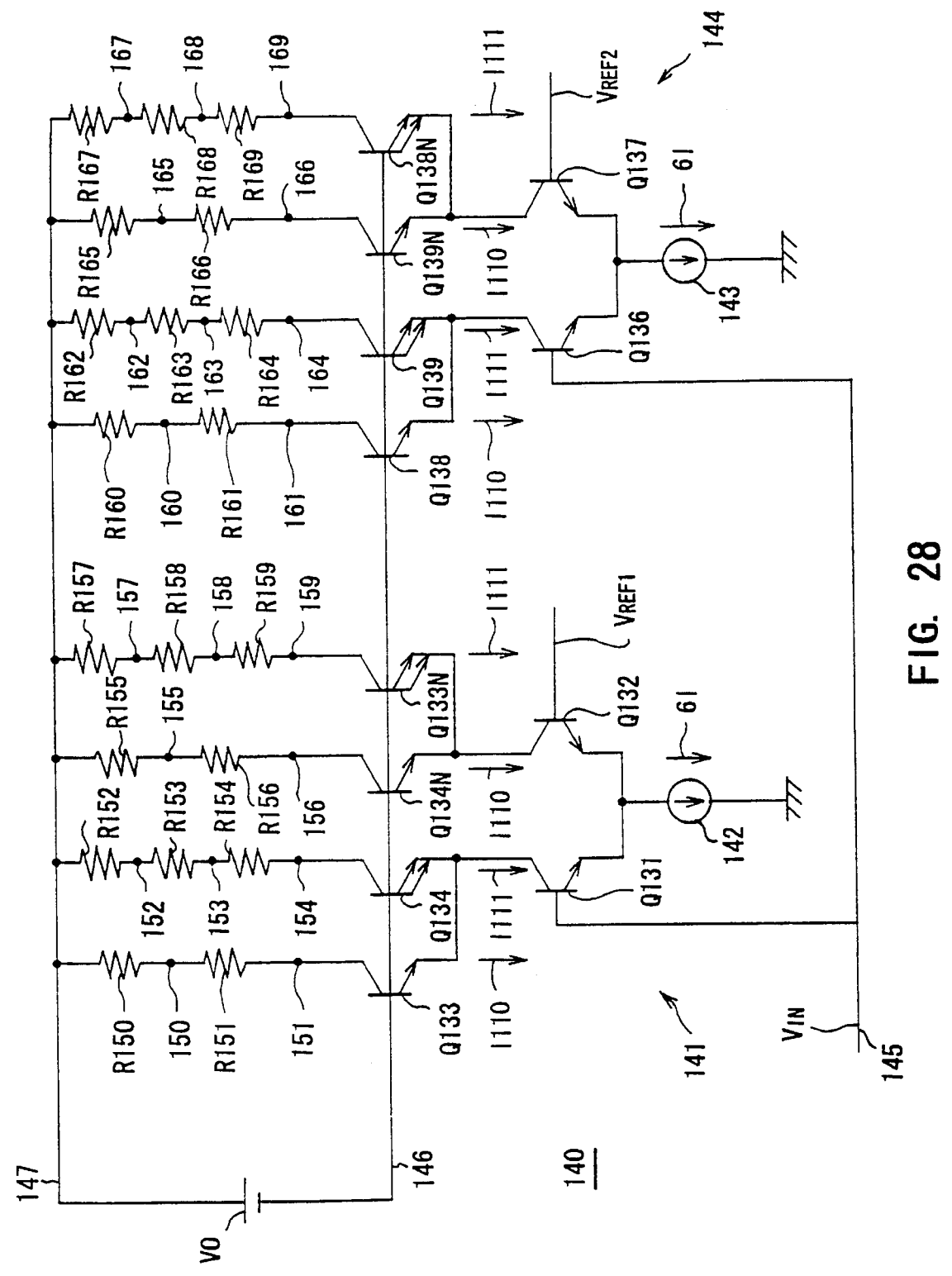

Next, the seventeenth embodiment of this invention will be explained using FIG. 28.

Numeral 140 denotes a complete 8-division interpolation type comparator. In this embodiment, the comparator 140 is constructed in such a manner that a load resistor for a transistor Q134 (Q133N, . . . ) having a relatively large emitter area is a series connection of three resistors R152, R153, and R154 (R157, R158 and R159, . . . ).

Furthermore, in the comparator 140, the resistances of the three resistors R152, R153, and R154 (R157, R158, and R159, . . . ) that are in series with the transistor Q134 (Q133N, . . . ) are set at values twofold, onefold and onefold the resistance r of the resistors R150 and R151 (R155, R156, . . . ) connected to the counterpart transistor Q133 (Q134N, . . . ), respectively.

With the above construction, an output voltage V152 given by equation (16):

$$V152 = Vcc - I101 \cdot 2R \qquad (16)$$
$$= Vcc - 4I100 \cdot R152$$

appears at a connection node 152 between the resistors R152 and R153. An output voltage V153 given by equation (17):

$$V153 = Vcc - I101 \cdot (2R152 + R153) \qquad (17)$$
$$= Vcc - 6I100 \cdot R152$$

also appears at a connection node 153 between the resistors R153 and R154.

Similarly, an output voltage V154 given by equation (18):

$$V154 = Vcc - I101 \cdot (2R152 + R153 + R154) \qquad (18)$$
$$= Vcc - 8I100 \cdot R152$$

appears at a connection node 154 between the resistor R154 and the transistor Q133. In this embodiment, the differences between the output voltages V150 and V151, output voltages V151 and V152, output voltages V152 and V153, and output voltages V153 and V154 have a ratio of 1:2:2:2.

Figure 29:
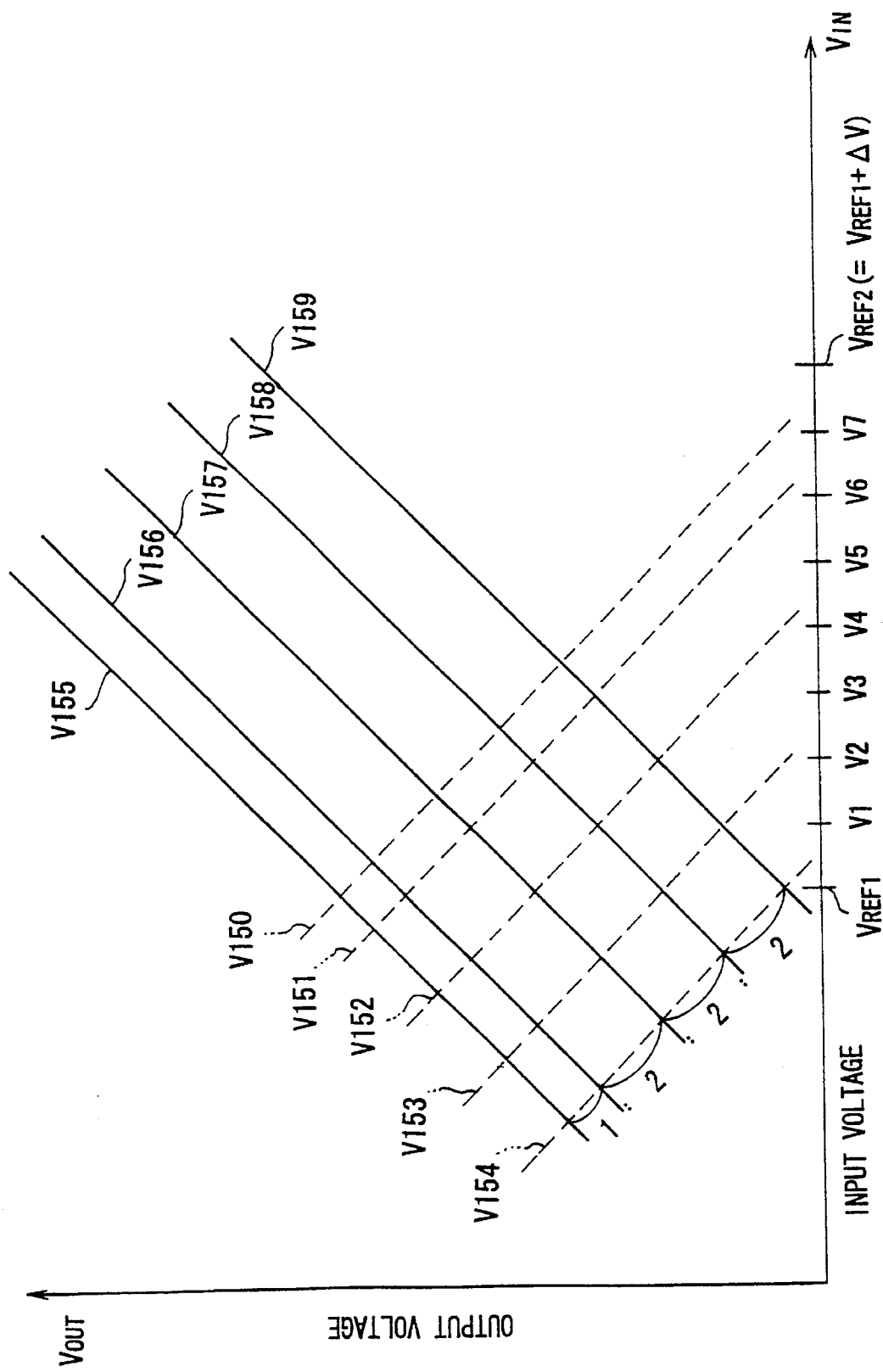
FIGS. 29 to 31 are diagrams for explaining the operation of the comparator of FIG. 28.
Figure 30:
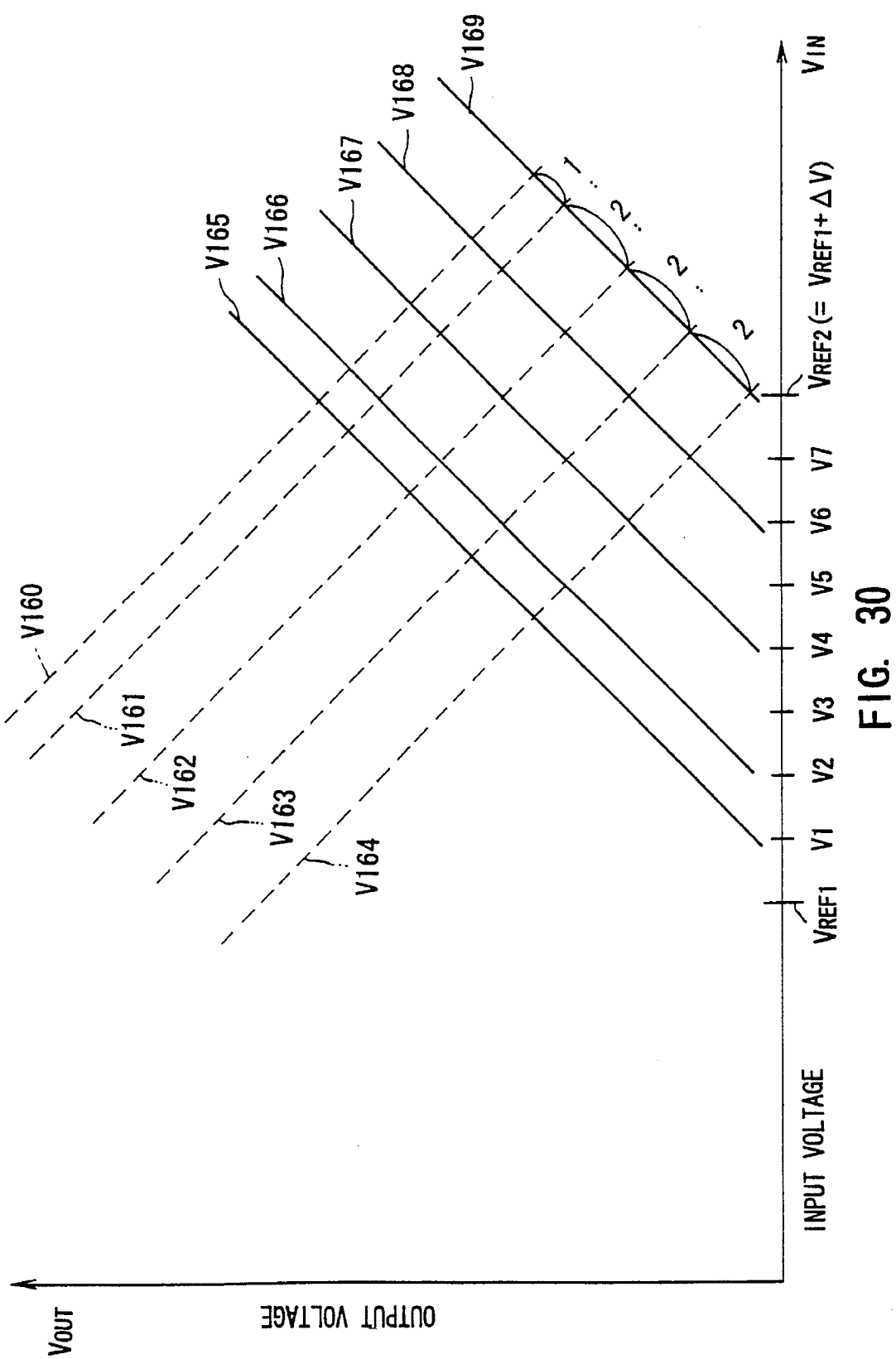

Therefore, the five pairs of in-phase output voltages V150, V151, V152, V153, and V154 and reversed-phase output voltages V155, V156, V157, V158, and V159 with respect to the reference voltage $V_{REF1}$ have an input-output characteristic with the input analog signal $V_{IN}$ as shown in FIG. 29. Furthermore, the five pairs of in-phase output voltages V160, V161, V162, V163, and V164 and reversed-phase output voltages V165, V166, V167, V168, and V169 with respect to the reference voltage $V_{REF2}$ have an input-output characteristic with the input analog signal $V_{IN}$ as shown in FIG. 30.

Figure 31:
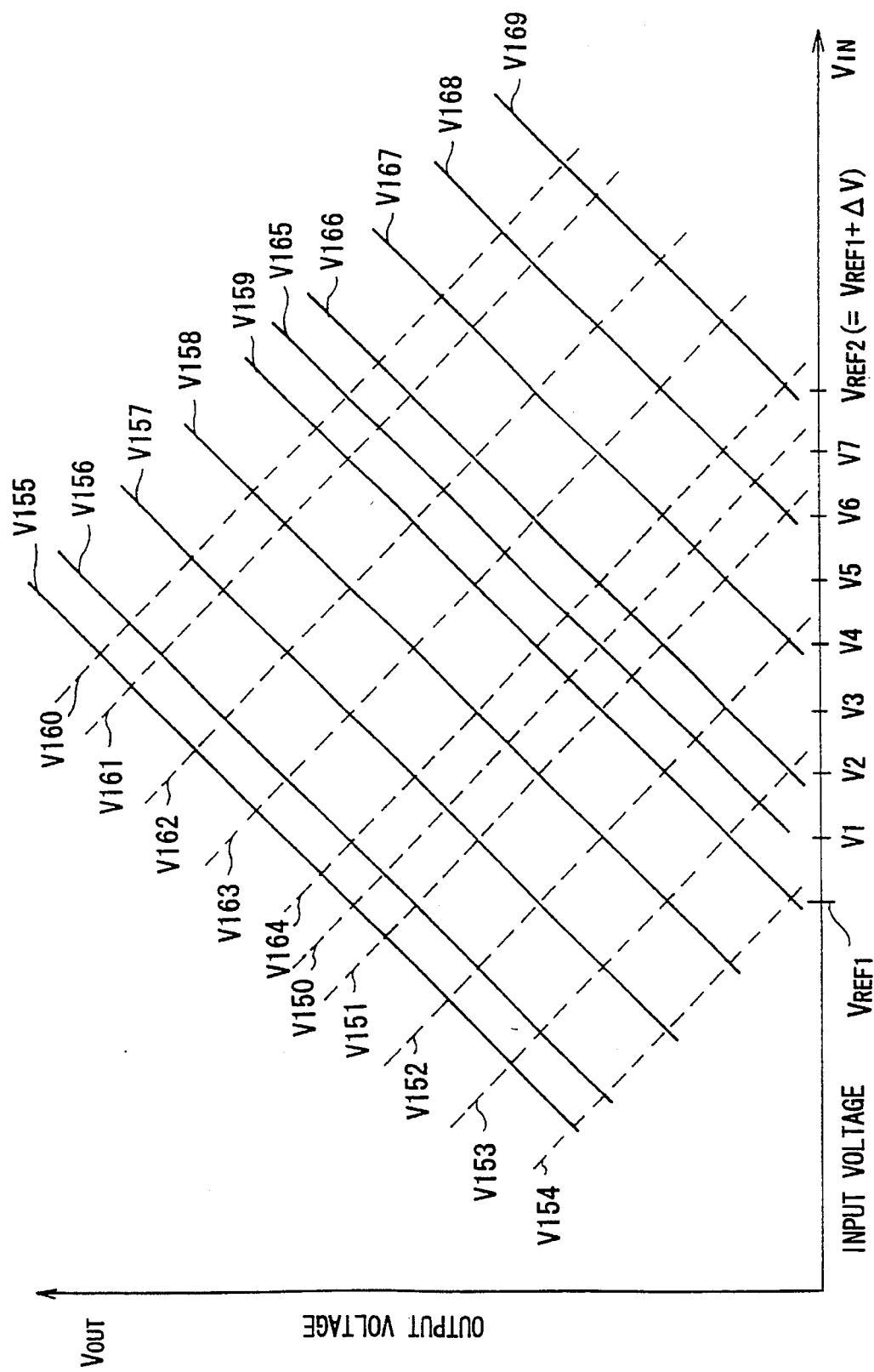

With the above construction, the output voltages with respect to the reference voltage $V_{REF1}$ and the output voltages with respect to the reference voltage $V_{REF2}$ have a relationship as shown in FIG. 31.

This embodiment uses the fact that the output voltages V154 and V159 that are lowest among the in-phase and reversed-phase output voltages of the differential amplifier 141 cross each other at the reference voltage $V_{REF1}$, and that the in-phase and reversed-phase output voltages V164 and V169 of the differential amplifier 144 cross each other at the reference voltage $V_{REF2}$.

This embodiment further uses the fact that the five pairs of in-phase and reversed-phase output voltages of the differential amplifier 31 have a ratio of 1:2:2:2 with respect to imaginary voltages V1 to V7 that equally divide the interval between the reference voltages $V_{REF1}$ and $V_{REF2}$ into eight, and that the five pairs of in-phase and reversed-phase output voltages of the differential amplifier 144 with respect to the imaginary voltages V1 to V7 also have a ratio of 1:2:2:2.

For example, the comparison output with respect to the virtual voltage V1 can be obtained by comparing the output voltages V155 and V158, and the comparison output with respect to the virtual voltage V2 can be obtained by comparing the output voltages V161 and V158.

The comparison outputs for the other virtual voltages V3 to V7 may be obtained by comparing ones selected from the combinations of the output voltages that cross each other at the virtual voltage concerned.

According to the above construction, the comparison outputs with respect to the virtual voltages V1 to V7 that equally divide the interval between the two reference voltages $V_{REF1}$ and $V_{REF2}$ into eight can be obtained by dividing the collector currents at a ratio of 1:2 as the differential output currents with the respective reference voltages, and by setting at 2:1:1 the resistances of the series resistors constituting the load resistor through which the larger collector current flows.

Since the time constants of the respective output voltages can be selected so as to be of substantially the same value, the output speeds can be made substantially equal to each other.

Next, the eighteenth embodiment of this invention will be described.

In the seventeenth embodiment described above, the load resistor connected to the collector of the current division transistor is a series connection of two or three resistors. However, this invention is not limited to this case, but it may be a series connection of four or more resistors.

Further, the nineteenth embodiment of this invention will be descried.

In the seventeenth embodiment described above, the resistances of the series resistors are set at a ratio of 1:1 or 1:2. However, the present invention is not limited to this case but they may be set at a ratio of 1:m (m=3, 4, 5, ... ) or other various ratios.

Further, the twentieth embodiment of this invention will be described.

In the seventeenth embodiment described above, the area ratio of the division transistors is set at 1:2. However, this invention is not limited to this case, but it may be set at 1:m (m=3, 4, 5, ... ).

In the latter case, the number and the resistance ratio of the resistors connected to the division transistor may be set at an arbitrary value and ratio.

Further, the twenty-first embodiment of this invention will be described.

In the above embodiments, the collector current as the comparison output of the input analog signal $V_{IN}$ with respect to each of the reference voltages $V_{REF1}$ and $V_{REF2}$ is divided into two currents. However, this invention is not limited to this case, but it may be divided into three or more currents.

In the latter case, the number and the resistance ratio of the resistors connected to the division transistor may be set at an arbitrary value and ratio.

Furthermore, the twenty-second embodiment of this invention will be described.

The above embodiments are concerned with a comparator of the type which produces comparison outputs of an input analog signal with respect to a plurality of virtual voltages simply by supplying it with two reference voltages $V_{REF1}$ and $V_{REF2}$. However, this invention is not limited to this case, but a comparator having this function may be used as a comparator in an A-D converter or other electronic circuits.

As described above, according to this invention, each of the comparison output currents with respect to each reference potential is divided at a predetermined ratio thus generating a plurality of divided output currents, and the output voltage generated by each divided comparison output current is further divided by an output means into a plurality of output voltages. Thereafter, the combination of output voltages, the relationship of which in magnitude is reversed at an intermediate potential between the first and second reference voltages, is selected and a comparison is made between those output voltages. Thus, a voltage comparison amplifier can easily be obtained which can produce comparison outputs for an input analog signal with respect to arbitrary imaginary voltages between the two reference potentials actually given.

Next, the twenty-third embodiment of this invention will be explained.

The construction and the operation of the series-parallel converter in which the interpolation method and the Vernier method are adopted for the comparator which is the principle described above.

Figure 32:
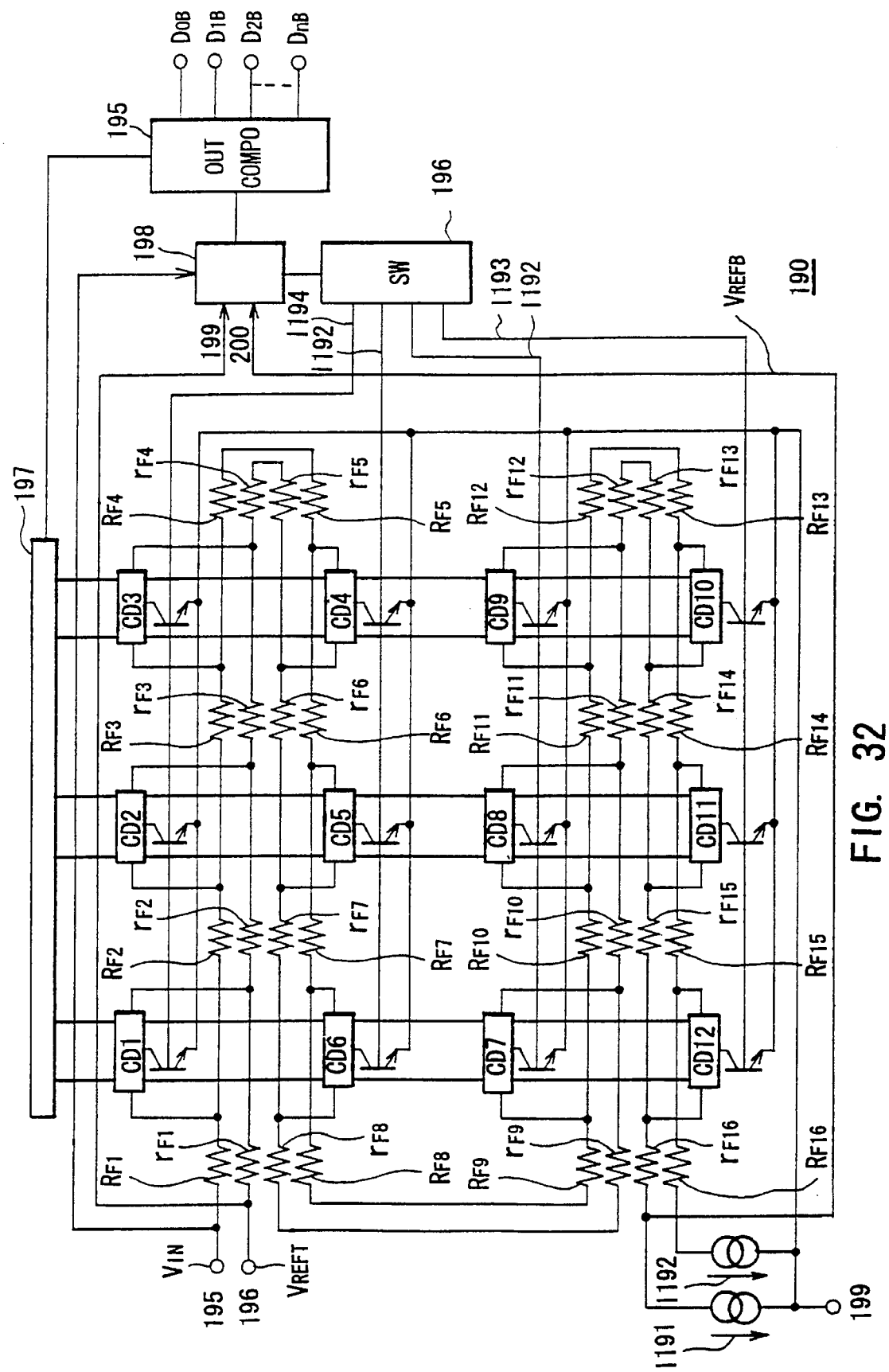
FIG. 32 is a circuit diagram of a series-parallel A-D converter in the twenty-third embodiment according to this invention.

In FIG. 32, 190 shows a serial-parallel A-D converter circuit as a whole. It is made so that the input terminal and the lowest level potential $V_{REFB}$ are connected with an array of voltage dividing resistors R ($R_{F1}$, $R_{F2}$, ... , $R_{F16}$) and current source I191 and an input analog signal $V_{IN}$ is fetched from the connection terminal of each resistance constituting an array of voltage dividing resistors array by dividing at a predetermined ratio.

First, an A-D converter circuit 190 supplies input signal $V_{IN}$, reference potential $V_{REFT}$, and $V_{REFB}$ to a high-order comparator 198, obtains a comparison output for two reference potentials $V_{REFT}$ and $V_{REFB}$ by use of two-division interpolation using complementary output explained above and a comparison output for an intermediate potential V2 (reference voltage $V_{U2}$ in a conventional example) which divides the above comparison output into two parts, and outputs these at the output composite circuit 195 and switch circuit 196.

A switch circuit 196 obtains from these three sets of comparison outputs which range the potential of input signal $V_{IN}$ belongs to among the four voltage ranges in which two reference potentials $V_{REFT}$ and $V_{REFB}$ are divided into equal parts and outputs bias currents I191, I192, I193, and I194 to the current source of low-order comparators CDi to CDi+2 (i=1, 4, 7, or 10) for three sets of low-order comparators which are lined in the same array among 12 sets of low-order comparators arranged in four arrays.

By the above, the A-D converter circuit shifts to the comparison operation between the corresponding attenuated analog signals VIi to VIi+2 (i=1, 4, 7, or 10) and the reference voltages $V_{REFi}$ to $V_{REFi+2}$ (i=1, 4, 7, or 10) with respect to the selected three sets of low-order comparators CDi to CD(i+2) (i=1, 4, 7 or 10).

The reference voltages $V_{REFi}$ is a voltage given from the connection terminal of each reference resistance $r_{Fi}$ of a reference resistance array r ($r_{F1}$, $r_{F2}$, ... , $r_{F16}$) which are connected between two reference voltages $V_{REFT}$ and $V_{REFB}$. The current value of the current source I192 which is connected between the array of the reference resistors r and the reference voltage $V_{REFB}$ is set at the same value as the current source I191. The resistance value of each reference resistance $r_{Fi}$ is set at a value two times the resistance value of each divider resistance $R_{Fi}$.

Therefore, the attenuated analog signals Vi to Vi+2 (i=1, 4, 7, or 10) which is inputted to low-order comparators CDi to CDi+2 (i=1, 4, 7, or 10) is attenuated with a one half voltage gradient for the voltage gradient of the reference voltage as explained in the first section. That is, the input analog signal $V_{IN}$ is equivalently expanded two times and inputted.

The A-D converter circuit 190 converts this comparison output into binary data by use of a low-order encoder 197, synthesizes this result of comparison and the previously obtained high-order result of comparison at an output composite circuit 195, and outputs as digital data.

According to the construction mentioned above, the A-D converter circuit 190 can attenuate the input signal $V_{IN}$ through the array of the voltage dividing resistors R, compare the equivalently expanded input signal $V_{IN}$ with the reference voltage by comparing the attenuated signal $V_{INi}$ with each reference voltage, and improve the SN ratio compared to conventional ones.

In addition, since the high-order comparators are interpolated by two-division, the number of high-order comparators can be reduced. As a result, the arrangement of high-order comparators can be made simple.

Therefore, power consumption of an A-D converter circuit built-in semiconductor integrated circuit can be reduced compared to conventional ones and chip area can also be made small.

In addition, materialization of a 10-bit or higher A-D converter circuit becomes easier. It is suitable for the signal processing circuit for high resolution digital display which is used in high definition television sets.

Next, the twenty-fourth embodiment of this invention will be described.

Furthermore, a case where the voltage gradient of input signal $V_{IN}$ which is attenuated by a voltage dividing resistor is set at one half the voltage gradient of the reference voltage which is given to each comparator has been described in the twenty-third embodiment. However, this invention is not limited to this, but may be widely applied even in cases where the voltage gradient by use of voltage dividing resistors is set at a value greater than one half the voltage gradient of a reference voltage and at a value smaller than that.

In addition, the twenty-fifth embodiment of this invention will be described. A case where the resistance ratio of voltage dividing resistors and reference resistors is made 1 to 2 and a constant-current source I191 which leads in the same constant current I is connected to each array of voltage dividing resistors has been described in the twenty-third embodiment. However, this invention is not limited to this, but the values of the divider resistance and the reference resistance may be made the same and the ratio of the constant current flowing in the constant-current source which is connected with each voltage dividing resistors array can be set at 1 to 2.

Furthermore, the twenty-sixth embodiment of this invention will be described.

A case where the comparison output of high-order comparator is interpolated by two-division has been described in the twenty-third embodiment. However, this invention is not limited to this, but may be widely applied even in cases the reference potentials $V_{REFT}$ and $V_{REFB}$ are interpolated by four-division and, further, in cases of six-division and seven-division by use of principle similar to that.

The twenty-seventh embodiment of this invention will be described.

A case where two sets of high-order comparators are used and five sets of reference voltages are generated from two reference potential (that is, four-division interpolation is carried out) has been described in the twenty-third embodiment. However, this invention is not limited to this, but it can be made so that, of collector currents in which a comparison output of a predetermined reference voltage is divided, the in-phase output is outputted to low-order comparators and the reversed phase output is inputted from high-order comparators and synthesized. In addition, the opposite combination is also applicable.

As mentioned above, according to this invention, a comparison output for a virtual reference voltage level V2 which divides a first reference voltage level which is actually generated into two parts is obtained by means of interpolation by comparing analog signal with the first reference voltage level in the high-order comparator section and, of its comparison output, by comparing the in-phase output signal and reversed-phase output signal obtained for reference voltage levels which are different from each other, and a second reference voltage level which is inputted to the low-order comparator section is switched. And after that, the comparison of analog signal, which is divided by means of a plurality of resistors which are connected in series, with the first reference voltage level allows the reduction of the number of transistors considerably compared to conventional ones, which are needed to constitute the high-order comparator section, and a serial-parallel analog-to-digital converter circuit with a small circuit area for its resolution capability can be obtained easily.

Next, the twenty-eighth embodiment of this invention will be explained.

The conversion process by use of serial-parallel analog-to-digital converter circuit will be described.

Figure 33:
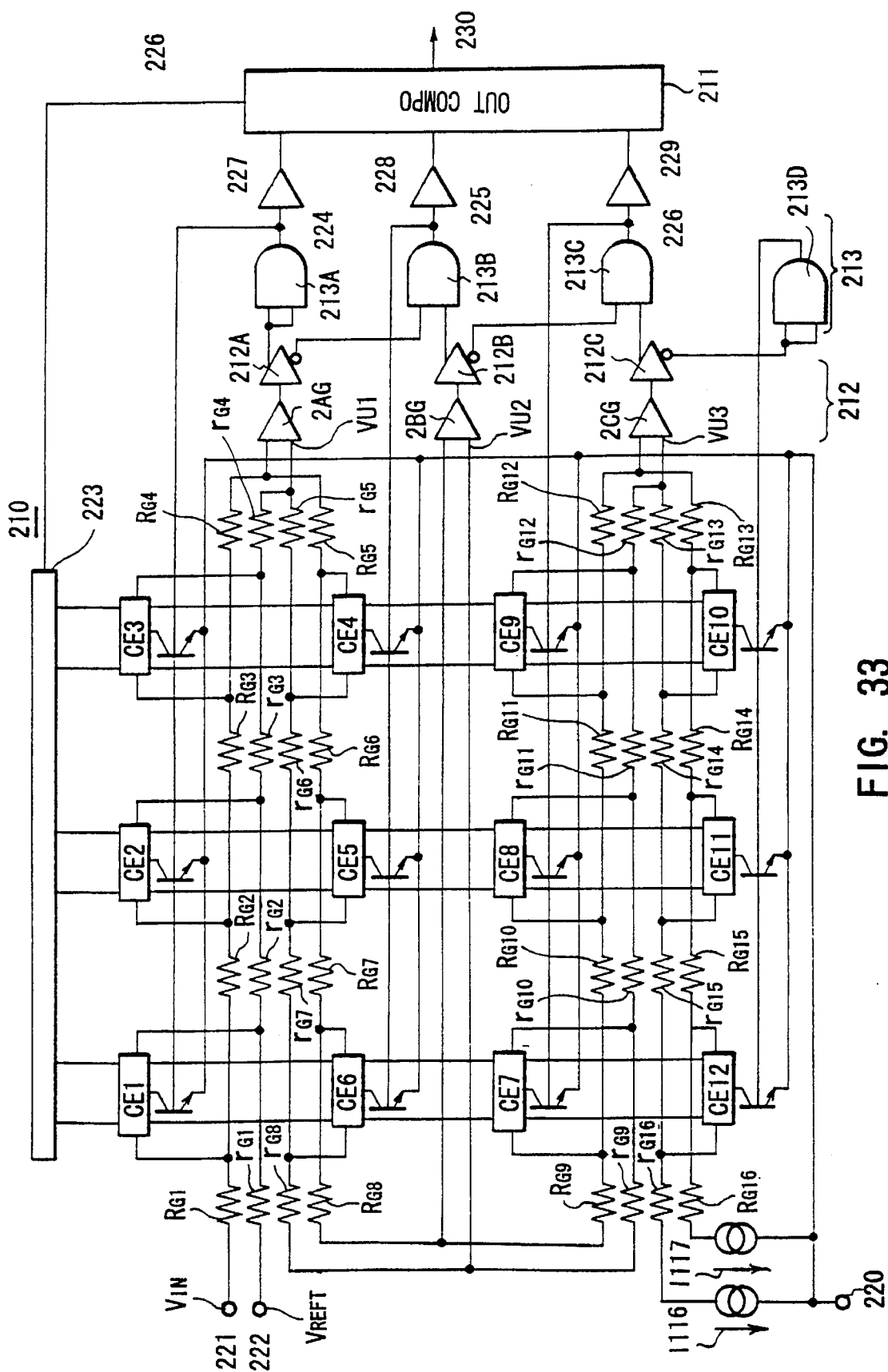
FIG. 33 is a circuit diagram of a series-parallel A-D converter in the twenty-eighth embodiment according to this invention.

A serial-parallel A-D converter circuit in which the above principle is used in the low-order comparators is shown in FIG. 33. In FIG. 33, 210 shows a serial-parallel A-D converter circuit as a whole. It is made so that the input terminal and the lowest level potential $V_{REFB}$ are connected with an array of voltage dividing resistors R ($R_{G1}$, $R_{G2}$, . . ., $R_{G16}$) and current source I116 and an input analog signal $V_{IN}$ is fetched from the connection terminal of each resistor constituting dividing resistor by dividing at a predetermined ratio.

First, an A-D converter circuit 210 compares the attenuated analog signals $V_{IN4}$, $V_{IN8}$, and $V_{IN12}$, which are generated by means of voltage dividing resistors R, with reference voltages VU1, VU2, and VU3, which are obtained by means of the array of reference resistors r, in comparators 2AG, 2BG, and 2CG, and outputs comparison output at an output composite circuit 211 through an AND circuit 213 as well as at the current source of low-order comparators as a bias voltage.

By the above, of the 12 sets of low-order comparators arranged in four rows, three sets of low-order comparators in the same row are selected. The A-D converter circuit 210 compares attenuated analog signals VIi to VIi+2 (i=1, 4, 7, or 10) with reference voltages $V_{REFi}$ to $V_{REFi+2}$ (i=1, 4, 7, or 10) corresponding to them in these three sets of low-order comparators CEi to CE(i+2) (i=1, 4, 7, or 10).

The reference voltages $V_{REFi}$ is given from the connection terminal of each reference resistor $r_{Gi}$ of an array of reference resistors r ($r_{G1}$, $r_{G2}$, ..., $r_{G16}$) which are connected between two reference voltages $V_{REFT}$ and $V_{REFB}$. In addition, the current value of the current source I117 which is connected between the array of reference resistors r and the reference voltage $V_{REFB}$ is the same value as the current source I116. The resistance value of each reference resistor $r_{Gi}$ is set at a value two times the resistance value of each dividing resistor $R_{Gi}$.

Therefore, the attenuated analog signals Vi to Vi+2 (i=1, 4, 7, or 10) which is supplied to low-order comparators CEi to CE(i+2) (i=1, 4, 7, or 10) is attenuated with a one half voltage gradient corresponding to the voltage gradient of the reference voltage as explained in the first section. This means that the input analog signal $V_{IN}$ is equivalently expanded two times.

The A-D converter circuit 210 obtains a comparison output of the attenuated analog signal for a virtual potential V2 which divides each reference voltage into two parts or a virtual potential which divides each reference voltage into four parts by using either of the two interpolation principles explained above.

For example, in cases where a comparison output for a virtual potential which divides a virtual voltage into two parts is obtained, when a comparison output for each reference voltage Vi is supplied from low-order comparators CEi (i=1, 2, ..., 12), a low-order encoder 223 obtains a comparison output including a virtual potential which further divides two reference potentials by comparison outputs which are in reversed-phase relationship with each other among comparative outputs to be outputted with respect to two reference potentials.

Then, this result of comparison is outputted to an output composite circuit 211 and combined with the result of high-order comparison which was inputted first, thereby outputting digital data in which input analog signal $V_{IN}$ is converted by high resolution for a reference potential generated by an array of reference resistors r.

According to the configuration mentioned above, the A-D converter circuit 210 can attenuate the input signal $V_{IN}$ through the voltage dividing resistors R, compare the equivalently expanded input signal $V_{IN}$ with the reference voltage by comparing the attenuated signal $V_{INi}$ with each reference voltage, and improve the S/N ratio compared to conventional ones.

In addition, a high resolution for the resolution which is actually generated by an array of reference resistors r can be materialized by two-division or four-division interpolating the comparison output of the low-order comparator, and the number of elements can be reduced considerably.

As a result, power consumption of an A-D converter circuit built-in semiconductor integrated circuit can be reduced compared to conventional ones and the chip area can also be made small.

In addition, materialization of a 10-bit or higher A-D converter circuit becomes easier. It is suitable for the signal processing circuit for high resolution digital display which is used in high definition television sets.

Next, the twenty-eighth embodiment of this invention will be described.

Furthermore, a case where the voltage gradient of input signal $V_{IN}$ which is attenuated by a dividing resistor is set at one half the voltage gradient of the reference voltage which is given to each comparator has been described in the twenty-seventh embodiment. However, this invention is not limited to this, but can be widely applied even in cases where the voltage gradient by use of voltage dividing resistors is set at a value greater than one half the voltage gradient of a reference voltage and at a value smaller than that.

In addition, the twenty-ninth embodiment will be described in the twenty-seventh embodiment, a case where the resistance ratio of voltage dividing resistors and reference resistors are made 1 to 2 and a constant-current source I116 which leads in the same constant current I is connected to each resistor array has been described. However, this invention is not limited to this, but the values of the dividing resistors and the reference resistors may be made the same and the ratio of the constant current flowing in the constant-current source which is connected with each resistance array can be set at 1 to 2.

Next, the thirtieth embodiment of this invention will be described.

Furthermore, a case where the comparison output of each comparator CDi is interpolated by four-division has been described in the twenty-seventh embodiment. However, this invention is not limited to this, but may also be designed to output the in-phase outputs of the divided collector current to the low-order comparator and to combine the reversed-phase outputs by inputting them from the high-order comparator. The combination opposite to this may also be applied.

Next, the thirty-first embodiment of this invention will be described.

Furthermore, a case where the comparison output of the comparator is interpolated and the comparison output for the virtual potentials bisectional or quadrisectional between reference voltages is obtained has been described in the twenty-seventh embodiment. However, this invention is not limited to this, but may also be widely applied in cases where a comparison output which divides the reference voltage into six equal parts, eight equal parts, and so on, is obtained.

As mentioned above, according to this invention, an analog signal is divided by means of a plurality of resistances connected in series, and the analog signals are inputted to the low-order comparator section and compared with the first reference voltage level. Then, of a pair of in-phase output signal and reversed-phase signal which are the comparison outputs of it, the in-phase output signal and reversed-phase output signal are compared, which are obtained for the reference voltage levels which are different from each other, thereby obtaining by interpolation a comparison output for a virtual reference voltage level which divides the actually generated first reference voltage level into two parts, and a serial-parallel analog-to-digital converter circuit with a small circuit area for its resolution capability can be obtained easily.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A voltage comparison circuit comprising:

a first differential amplifying means for comparing an input analog signal with a first reference potential to produce a first output current and a second output current;

a second differential amplifying means for comparing the input analog signal with a second reference potential to produce a third output current and a fourth output current;

a first current dividing means for dividing the first output current to produce a plurality of divided output currents as first divided output currents;

a second current dividing means for dividing the second output current to produce a plurality of divided output currents as second divided output currents;

a third current dividing means for dividing the third output current to produce a plurality of divided output currents as third divided output currents;

a fourth current dividing means for dividing the fourth output current to produce a plurality of output currents as fourth divided output currents;

a first output means for dividing each of a plurality of output voltages that are generated in accordance with the plurality of output currents as the first divided output currents into a plurality of output voltages, and for outputting the plurality of division-generated output voltages as reversed-phase comparison outputs that are in reversed-phase with the input analog signal;

a second output means for dividing each of a plurality of output voltages that are generated in accordance with the plurality of output currents as the second divided output currents into a plurality of output voltages, and for outputting the plurality of division-generated output voltages as in-phase comparison outputs that are in-phase with the input analog signal;

a third output means for dividing each of a plurality of output voltages that are generated in accordance with the plurality of output currents as the third divided output currents into a plurality of output voltages, and for outputting the plurality of division-generated output voltages as in-phase comparison outputs that are in-phase with the input analog signal;

a fourth output means for dividing each of a plurality of output voltages that are generated in accordance with the plurality of output currents as the fourth divided output currents into a plurality of output voltages, and for outputting the plurality of division-generated output voltages as reversed-phase comparison outputs that are reversed-phase with the input analog signal; and a processing means for outputting comparison outputs of the input analog signal with respect to virtual potentials that internally divide the first and second reference potentials at an arbitrary ratio by comparing comparison outputs in reversed-phase with each other that are selected from the plurality of comparison outputs produced by the first, second, third, and fourth output means.

2. A voltage comparison circuit according to claim 1, wherein:

each of the first and second current dividing means is a parallel connection of common-base transistors, the emitters of which are connected to an output terminal of the first differential amplifying means; and each of the third and fourth current dividing means is a parallel connection of common-base transistors, the emitters of which are connected to an output terminal of the second differential amplifying means.

3. A voltage comparison circuit according to claim 1, wherein each of the first, second, third and fourth output means is a series connection of a plurality of resistor means, the resistances of which are set at a predetermined ratio.

4. A voltage comparison circuit according to claim 3, wherein all of the resistances of the plurality of resistor means are set at the same value.

5. A voltage comparison circuit comprising:

a first differential amplifying means for comparing an input analog signal with a first reference potential to produce a first output current and a second output current;

a second differential amplifying means for comparing the input analog signal with a second reference potential to produce a third output current and a fourth output current;

a first current dividing means for dividing the first output current at a ratio of 1:2 to produce two divided output currents as first divided output currents;

a second current dividing means for dividing the second output current at a ratio of 1:2 to produce two divided output currents as second divided output currents;

a third current dividing means for dividing the third output current at a ratio of 1:2 to produce two divided output currents as third divided output currents;

a fourth current dividing means for dividing the fourth output current at a ratio of 1:2 to produce two output currents as fourth divided output currents;

a first output means for dividing each of the output voltages that are generated in accordance with the two output currents as the first divided output currents into two output voltages, and for outputting the four division-generated output voltages as reversed-phase comparison outputs that are in reversed-phase with the input analog signal;

a second output means for dividing each of the output voltages that are generated in accordance with the two output currents as the second divided output currents into two output voltages, and for outputting the four division-generated output voltages as in-phase comparison outputs that are in in-phase with the input analog signal;

a third output means for dividing each of the output voltages that are generated in accordance with the two output currents as the third divided output currents into two output voltages, and for outputting the four division-generated output voltages as in-phase comparison outputs that are in-phase with the input analog signal;

a fourth output means for dividing each of the output voltages that are generated in accordance with the two output currents as the fourth divided output currents into two output voltages, and for outputting the four division-generated output voltages as reversed-phase comparison outputs that are reversed-phase with the input analog signal; and a processing means for outputting comparison outputs of the input analog signal with respect to virtual potentials that divide an interval between the first and second reference potentials into six by comparing comparison outputs in reversed-phase with each other that are selected from the four sets of comparison outputs produced by the first, second, third, and fourth output means.

6. A voltage comparison circuit comprising:

a first differential amplifying means for comparing an input analog signal with a first reference potential to produce a first output current and a second output current;

a second differential amplifying means for comparing the input analog signal with a second reference potential to produce a third output current and a fourth output current;

a first current dividing means for dividing the first output current at a ratio of 1:2 to produce two divided output currents as first divided output currents;

a second current dividing means for dividing the second output current at a ratio of 1:2 to produce two divided output currents as second divided output currents;

a third current dividing means for dividing the third output current at a ratio of 1:2 to produce two divided output currents as third divided output currents;

a fourth current dividing means for dividing the fourth output current at a ratio of 1:2 to produce two output currents as fourth divided output currents;

a first output means for dividing one of the output voltages that are generated in accordance with the two output currents as the first divided output currents into two and dividing the other output voltage into three, and for outputting the five division-generated output voltages as reversed-phase comparison outputs that are in reversed-phase with the input analog signal;

a second output means for dividing one of the output voltages that are generated in accordance with the two output currents as the second divided output currents into two and dividing the other output voltage into three, and for outputting the five division-generated output voltages as in-phase comparison outputs that are in in-phase with the input analog signal;

a third output means for dividing one of the output voltages that are generated in accordance with the two output currents as the third divided output currents into two and dividing the other output voltage into three, and for outputting the five division-generated output voltages as in-phase comparison outputs that are in-phase with the input analog signal;

a fourth output means for dividing one of the output voltages that are generated in accordance with the two output currents as the fourth divided output currents into two and dividing the other output voltage into three, and for outputting the five division-generated output voltages as reverse-phase comparison outputs that are reversed-phase with the input analog signal; and a processing means for outputting comparison outputs of the input analog signal with respect to virtual potentials that divide an interval between the first and second reference potentials into eight by comparing comparison outputs in reverse-phase with each other that are selected from the five sets of comparison outputs produced by the first, second, third, and fourth output means.

* * * * *